(12) United States Patent
Bishtein et al.

(10) Patent No.: US 9,985,462 B2
(45) Date of Patent: May 29, 2018

(54) POWER TRANSMITTING UNIT AND POWER RECEIVING UNIT WITH CONTROL DATA COMMUNICATION AND METHODS FOR USE THEREWITH

(71) Applicant: BROADCOM CORPORATION, Irvine, CA (US)

(72) Inventors: Vadim Bishtein, Sunnyvale, CA (US); Marius Ionel Vladan, Oudenaarde (BE)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 184 days.

(21) Appl. No.: 14/980,296

(22) Filed: Dec. 28, 2015

(65) Prior Publication Data

US 2016/0111894 A1 Apr. 21, 2016

Related U.S. Application Data

(63) Continuation-in-part of application No. 14/319,357, filed on Jun. 30, 2014, now Pat. No. 9,634,494.

(60) Provisional application No. 62/255,080, filed on Nov. 13, 2015, provisional application No. 61/970,147, filed on Mar. 25, 2014.

(51) Int. Cl.
| | |
|---|---|
| *H01F 27/42* | (2006.01) |
| *H02J 7/02* | (2016.01) |
| *H03F 1/02* | (2006.01) |
| *H03F 3/217* | (2006.01) |
| *H03F 3/24* | (2006.01) |
| *H02J 7/00* | (2006.01) |
| *H02J 50/10* | (2016.01) |
| *H02J 50/40* | (2016.01) |
| *H02J 7/34* | (2006.01) |

(52) U.S. Cl.
CPC ............ *H02J 7/025* (2013.01); *H02J 7/0027* (2013.01); *H02J 50/10* (2016.02); *H02J 50/40* (2016.02); *H03F 1/0294* (2013.01); *H03F 3/2171* (2013.01); *H03F 3/2173* (2013.01); *H03F 3/245* (2013.01); *H02J 7/345* (2013.01)

(58) Field of Classification Search
CPC ........ H05B 33/0815; H02J 5/005; H02J 17/00
See application file for complete search history.

(56) References Cited

U.S. PATENT DOCUMENTS

2015/0108847 A1* 4/2015 Taylor .................... H02J 50/12
307/104

* cited by examiner

*Primary Examiner* — Sibin Chen
(74) *Attorney, Agent, or Firm* — Garlick & Markison; Bruce E. Stuckman

(57) ABSTRACT

Aspects of the subject disclosure may include, for example, a wireless power receiver configured to receive a wireless power signal from a power transmitting unit. A wireless radio unit is configured to communicate with the power transmitting unit. A controllable rectifier circuit is configured to rectify the wireless power signal. The controllable rectifier circuit can include a rectifier configured to generate a rectified voltage from the wireless power signal, based on switch control signals. A rectifier control circuit is configured to generate the switch control signals and to generate first control data that indicates a first rectifier duty cycle of the switch control signals. The wireless radio unit sends the first control data to the power transmitting unit. Other embodiments are disclosed.

20 Claims, 22 Drawing Sheets

POWER TRANSMITTING UNIT AND POWER RECEIVING UNIT WITH CONTROL DATA COMMUNICATION AND METHODS FOR USE THEREWITH

CROSS-REFERENCE TO RELATED APPLICATIONS

The present U.S. Utility Patent Application claims priority under 35 U.S.C. 119(e) to U.S. Provisional Application No. 62/255,080, entitled, "POWER TRANSMITTING UNIT AND POWER RECEIVING UNIT WITH CONTROL DATA COMMUNICATION AND METHODS FOR USE THEREWITH," filed on Nov. 13, 2015, which is hereby incorporated herein by reference in its entirety and made part of the present U.S. Utility Patent Application for all purposes.

The present U.S. Utility Patent Application claims priority pursuant to 35 U.S.C. § 120 as a continuation-in-part of U.S. Utility application Ser. No. 14/319,357, entitled "POWER AMPLIFIER FOR WIRELESS POWER TRANSMISSION", filed Jun. 30, 2014, which claims priority pursuant to 35 U.S.C. § 119(e) to U.S. Provisional Application No. 61/970,147, entitled "POWER AMPLIFIER FOR WIRELESS POWER TRANSMISSION", filed Mar. 25, 2014, both of which are hereby incorporated herein by reference in their entirety and made part of the present U.S. Utility Patent Application for all purposes.

BACKGROUND TECHNICAL FIELD

Various embodiments relate generally to wireless communication systems and also to wireless charging of devices.

DESCRIPTION OF RELATED ART

Communication systems are known to support wireless and wireline communications between wireless and/or wireline communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, Bluetooth Low Energy (BLE), advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

The Alliance for Wireless Power (A4WP) has promulgated a baseline systems specification for interoperability of loosely coupled wireless power transfer for portable, handheld electronic devices. This specification supports a 6.78 MHz for power transfers and a 2.4 GHz operating frequency for management data transfers. The Wireless Power Consortium (WPC) has also promulgated standards used for wireless charging of mobile devices, notably the Qi low power specification.

DETAILED DESCRIPTION

Figure 1:
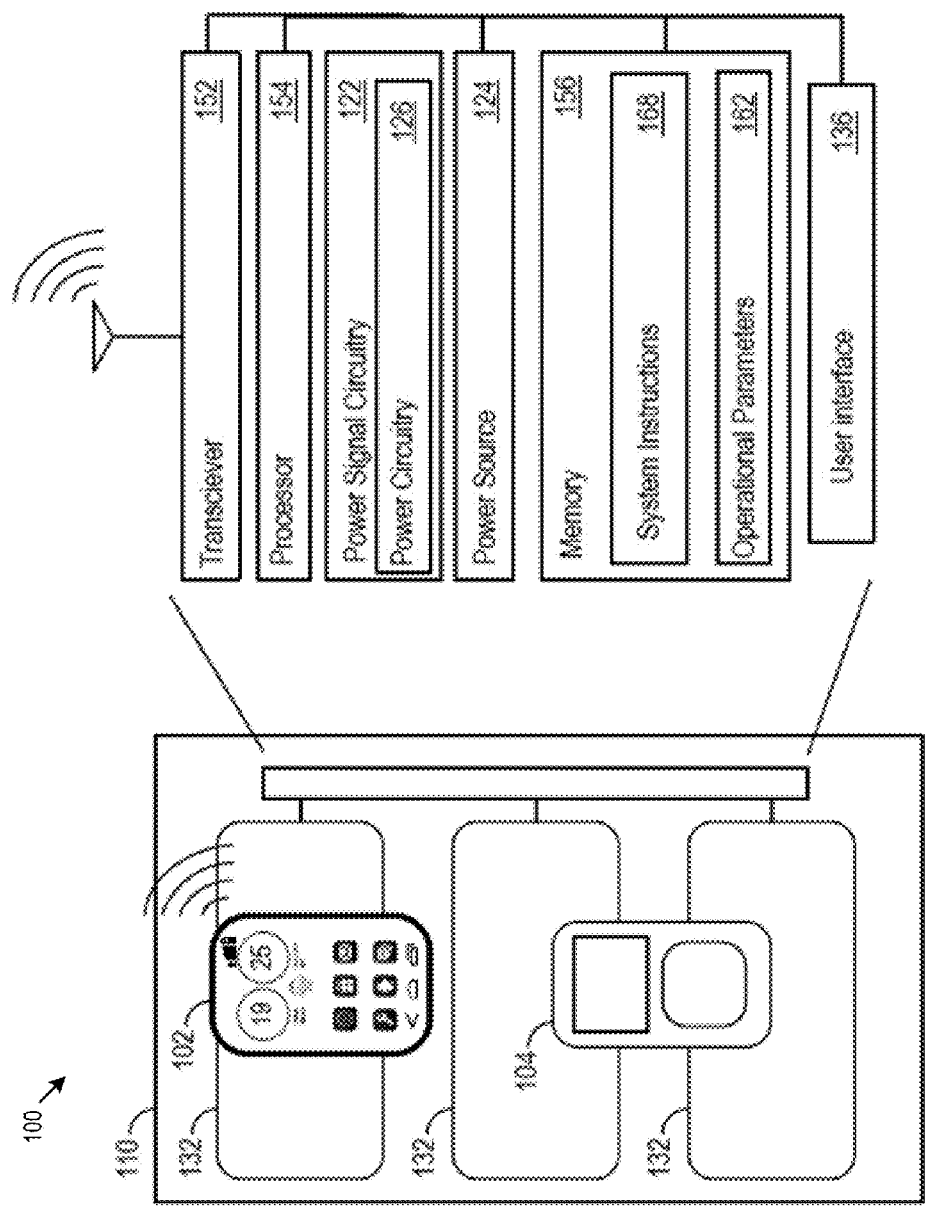
FIG. 1 is a schematic block diagram of an example wireless power environment.

FIG. 1 shows an example wireless power environment 100. The wireless power environment 100 includes a number of portable devices 102, 104 and a charging station (CS) 110 in this example, but the wireless power environment may include any device. The techniques described below regarding wireless power may be implemented in virtually any wireless power scenario. For example, the devices 102 receiving the wireless power may charge a battery, capacitor, or other energy storage subsystem. Additionally or alternatively, the devices 102, 104 may operate directly on the power received from the CS 110.

The CS 110 may include power signal circuitry (PSC) 122 to supply a power signal to a transmit coil 132 able to transmit the power signals to the portable devices 102. The CS 110 may include a power source 124 to support generation of the transmitted power signal. The PSC 122 may convert a source signal from the power source 124 into a form that the antenna may transmit. For example, the power source may provide a direct current (DC) or alternating current (AC) signal. The PSC 122 may include power circuitry 126 which may tune the basic signal from the power source to a particular frequency or signal level for transmission over the transmit coil 132 to the devices 102.

In various implementations, the CS 110 may include a transceiver 152 to support RF communication, one or more processors 154 to support execution of instructions, e.g., in the form of applications, and carry out general operation of the device. The CS 110 may include memory 156 for execution support and storage of system instructions 168 and operation parameters 162. In some implementations, the transceiver elements may receive status and/or control signals from the portable devices 102. In some implementations, the control and/or status signals may be used by the CS 110 to adjust power signal parameters and/or other wireless power provisional strategies. For example, the signals may allow for detection of new devices within the power signal range, determination of when a device in range has completed charging, and/or other status or control determinations. For example, a device 102 may in communication with the CS 110 over a wireless protocol, e.g. Bluetooth, Wi-Fi or other wireless protocol via transceiver 152. Additionally or alternatively, the CS may monitor internal parameters for status determination. For example, the load of 132 may be monitored to determine the presence/absence of devices within power signal range. For example, monitoring of internal parameters may be used to support charging of a device 104 which may not be in data communication with the CS 110. The communication device may include a user interface 136 to allow for user operation of the device.

For wireless power transmission, current may be supplied to a transmit coil. In some cases, the current supplied to the transmit coil may depend on the load of the transmit coil. For example, the current in a class D power transmission circuit may be expressed as:

$$\frac{2 \cdot VDC}{\pi} \cdot \frac{1}{|Zload|} \qquad \text{Equation 1}$$

where Zload is the impedance of the transmit coil and VDC is a voltage supplied by a voltage source.

In some cases, the current level in the transmit coil may be controlled by varying VDC. For example, the voltage source may be a buck-boost converter, with a constant DC power supply. The buck-boost converter may allow the adjustment of the current over a range. For example, this range may vary from 0-40V for class E power transmission circuits and vary from 0-80V for class D power transmission circuits. These example voltages may be supplied for systems operating at 1 A (root-mean-squared, rms) and for a load impedance of up to 36Ω.

In some implementations, the value of Zload may vary over time. For example, when receiving antennas or other objects move in to or out of proximity of the transmit coil, the load of the transmit coil will vary. In some implementations, the voltage supplied by the voltage source may be adjusted to keep the peak current flowing in the transmit coil constant.

Figure 2:
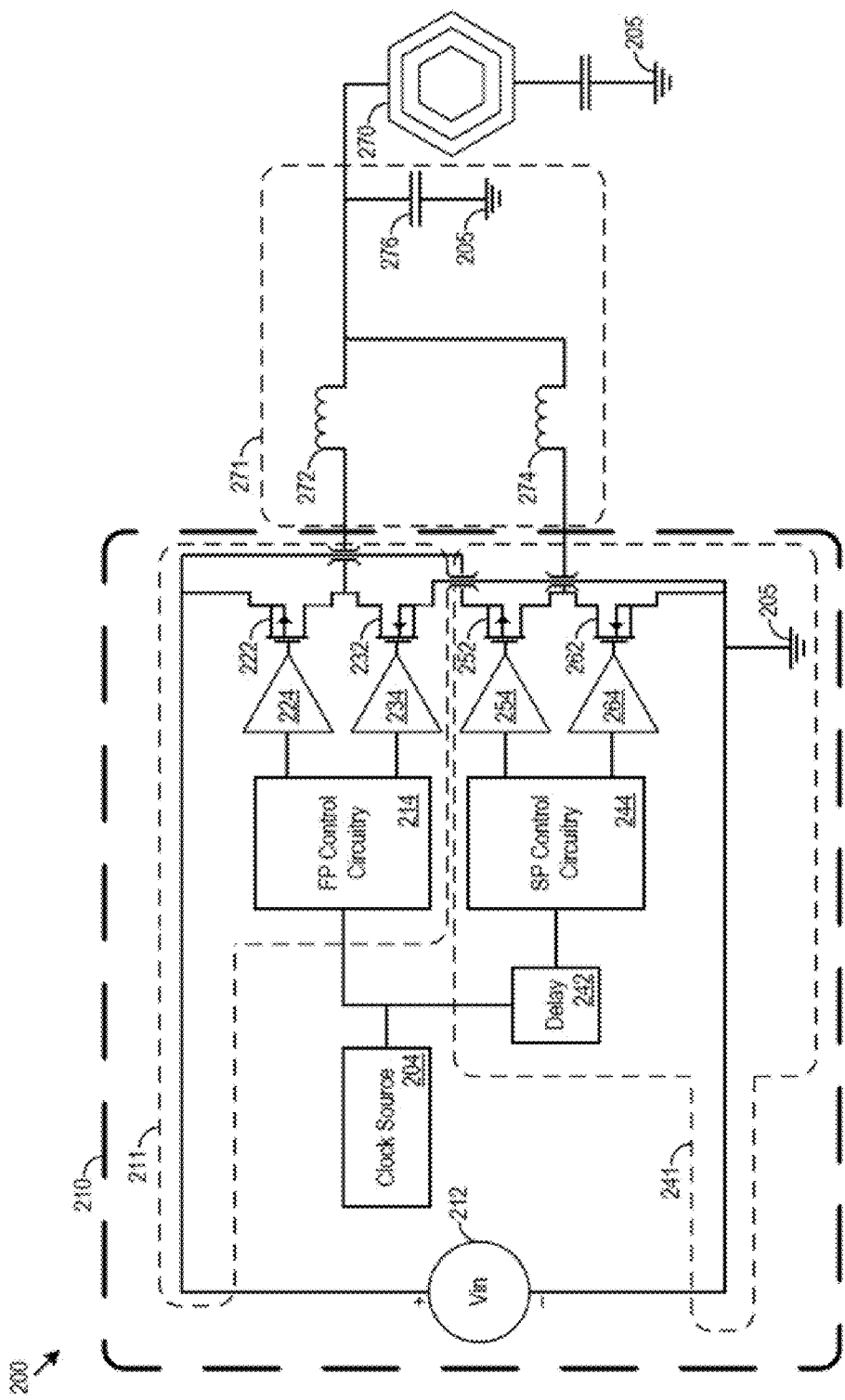
FIG. 2 is a graphical diagram of example circuitry for wireless power transmission.

FIG. 2 shows example circuitry 200 for wireless power transmission, including a power signal source 210. In some implementations, the power signal source 210 may provide a sinusoidal, other oscillating waveform, or other time varying waveform, current to a transmit coil 270. The power signal source may use the output of a voltage source 212 as a base signal. In some implementations, the voltage source 212 may supply a DC voltage. The power signal source 210, which may include two paths 211, 241 having high-side and low side modulators 222, 232, 252, 262. The high-side modulators 222, 252 are tied to the high-side output of the voltage source 212. The low-side modulators 232, 262 may be coupled to the low side of the voltage source and reference level 205, e.g. ground. In various implementations, the high-side and low side modulators 222, 232, 252, 262 may be positive metal-oxide semiconductor (pMOS) transistors or negative metal-oxide semiconductor (nMOS) transistors. Additionally or alternatively, bipolar junction transistors (BJT) may be implemented.

The two paths 211, 241 may receive a clock signal from the clock source 204. The clock signal may be passed along the first path (FP) 211 to the FP control circuitry 214. The FP control circuitry 214 may control FP drivers 224 and 234. For example, the FP control circuitry may control the amplification level of the drivers 224, 234 based on system conditions. In some cases, the amplification level may be set to achieve a determined on-off signal ratio for the FP modulators 222, 232. In some implementations, the FP control circuitry may supply operational voltages to the FP drivers to serve as a power source. The FP control circuitry 214 may pass the clock signal to the FP drivers 224, 234. The FP drivers 224, 234 may amplify the clock signal to drive the FP high-side 222 and low-side 232 modulators.

The FP modulators 222, 232 may produce an oscillating power signal by modulating the output of the voltage source 212. For example, the FP high-side 222 and low-side 232 modulators may cooperatively produce a 50% duty cycle square-wave signal through coordinated on-off switching.

The clock source 204 may also pass the clock signal along the second path (SP) 241. The SP may include a phase delay 242. The phase delay may shift the phase of the clock signal on the SP by an angle, Φ, with respect to the clock signal on the FP. The delayed clock signal is output coupled from the phase delay 242 to the SP control circuitry 244. The SP control circuitry 244 may control SP drivers 254, 264. The SP drivers 254, 264 may amplify the clock signal to drive the SP high-side 252 and low-side 262 modulators.

The SP modulators 252, 262 may produce an oscillating power signal by modulating the output of the voltage source 212. For example, the SP high-side 252 and low-side 262 modulators may cooperatively produce a 50% duty cycle square-wave signal through coordinated on-off switching. The oscillating signal produced by the SP modulators 252, 262 may be shifted with respect that produced by the FP modulators by the angle Φ. In some cases, the FP oscillating signal may be considered to have phase Φ/2 and the SP oscillating signal may be considered to have phase −Φ/2.

The output of the FP 222, 232 and SP 252, 262 modulators may be passed through a filter 271 including inductors 272, 274 and parallel or series capacitive 276 elements. The filter 271 may act as a LC filter and establish a center frequency, ω0, for the example circuitry 200. The output of the filter may be passed to the antenna coil. In some implementations ω0 may be expressed as:

$$\omega 0 = \frac{1}{\sqrt{Linv \cdot Cinv}} \qquad \text{Equation 2}$$

where Linv is the inductance associated with the filter 271 and Cinv is the capacitance associated with the filter 271. In the filter 271, the two input branches from the FP and the SP are passed through inductors 272 and 274, which may have inductance values 2*Linv. In the example circuitry 200, the halves of the signal are exposed to 2*Linv before being combined. This may have a similar effect to passing the combined current through an inductor of value Linv.

In some implementations the circuitry 200 may act as a current source and the peak amplitude current (iload) may not be dependent on the load of the transmit coil 270. In some cases, combining the two signals from the FP and the SP may allow the iload to be controlled by adjusting the angle Φ. Adding two repeating signals where one signal constitutes a phase shift of the other results in a third signal of the same time with an amplitude that depends on the angle and a phase shift that depends on the angle. For example, iload may be expressed as:

$$iload = \frac{2 \cdot \omega 0 \cdot Cinv \cdot Vin}{\pi} \cos\left(\frac{\Phi}{2}\right) \quad \text{Equation 3}$$

where Vin is the voltage supplied by the voltage source 212.

Figure 3:
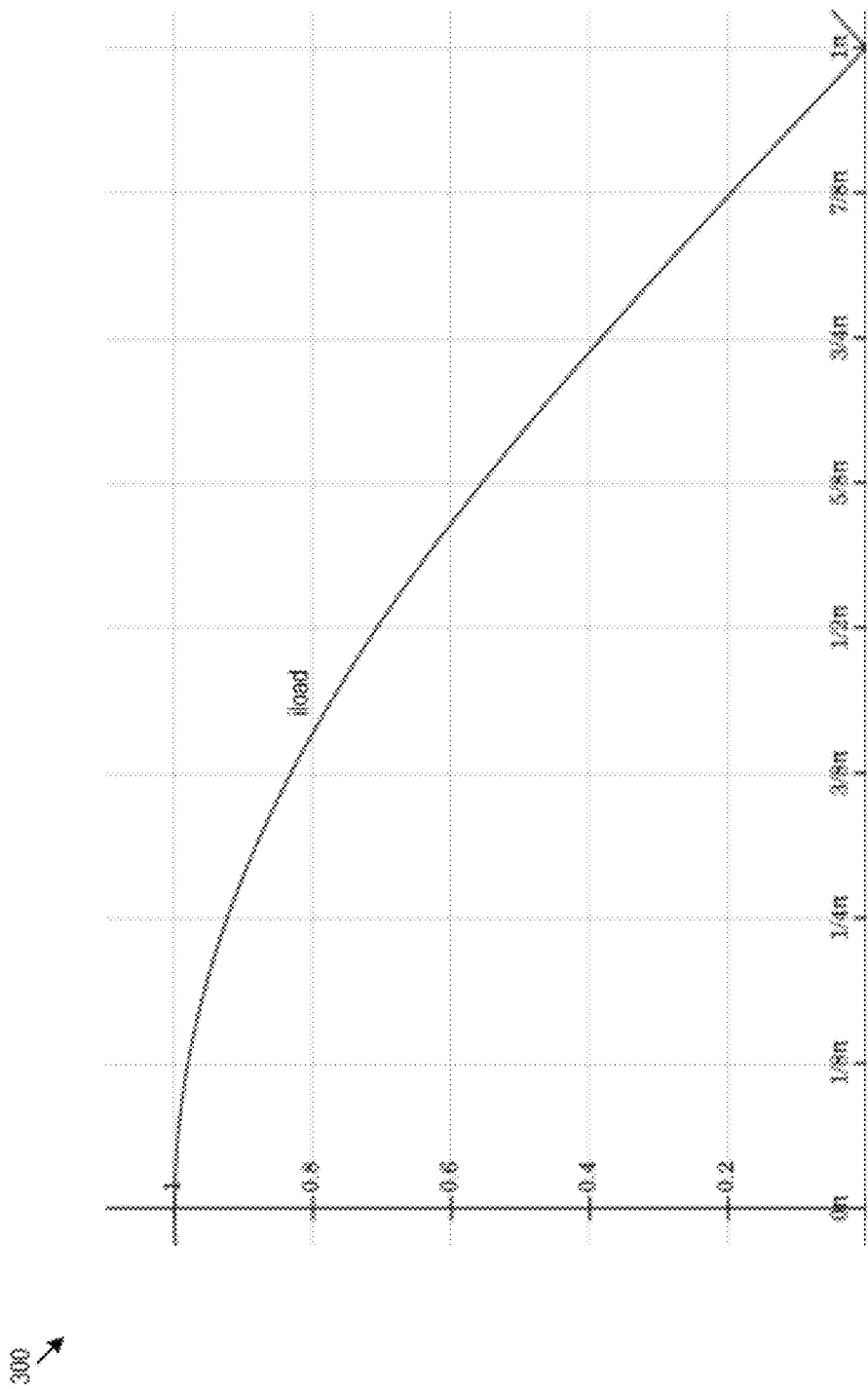
FIG. 3 is a schematic block diagram of an example plot of iload versus the angle Φ.

FIG. 3 shows an example plot 300 of iload versus the angle Φ. In the example plot 300, the value of iload is normalized using the largest value of iload to produce a unitless quantity versus the angle Φ. The largest value of iload may be controlled by setting the parameters of the circuitry 200. For example, Vin and/or Cinv may be adjusted to increase or decrease the range on which iload can be varied.

In some cases, phase based modulation may allow for high-speed current level changes within the transmit coil. High-frequency changes in the current may be achieved. In some implementations, the voltage level used in the circuitry 200 may be defined by the application of the circuitry 200. For example, the transmit coil load may not contribute to selection of the implemented voltage level. In some cases, a reduced voltage level range may allow for the use of more compact integrated or discrete components.

Figure 4:
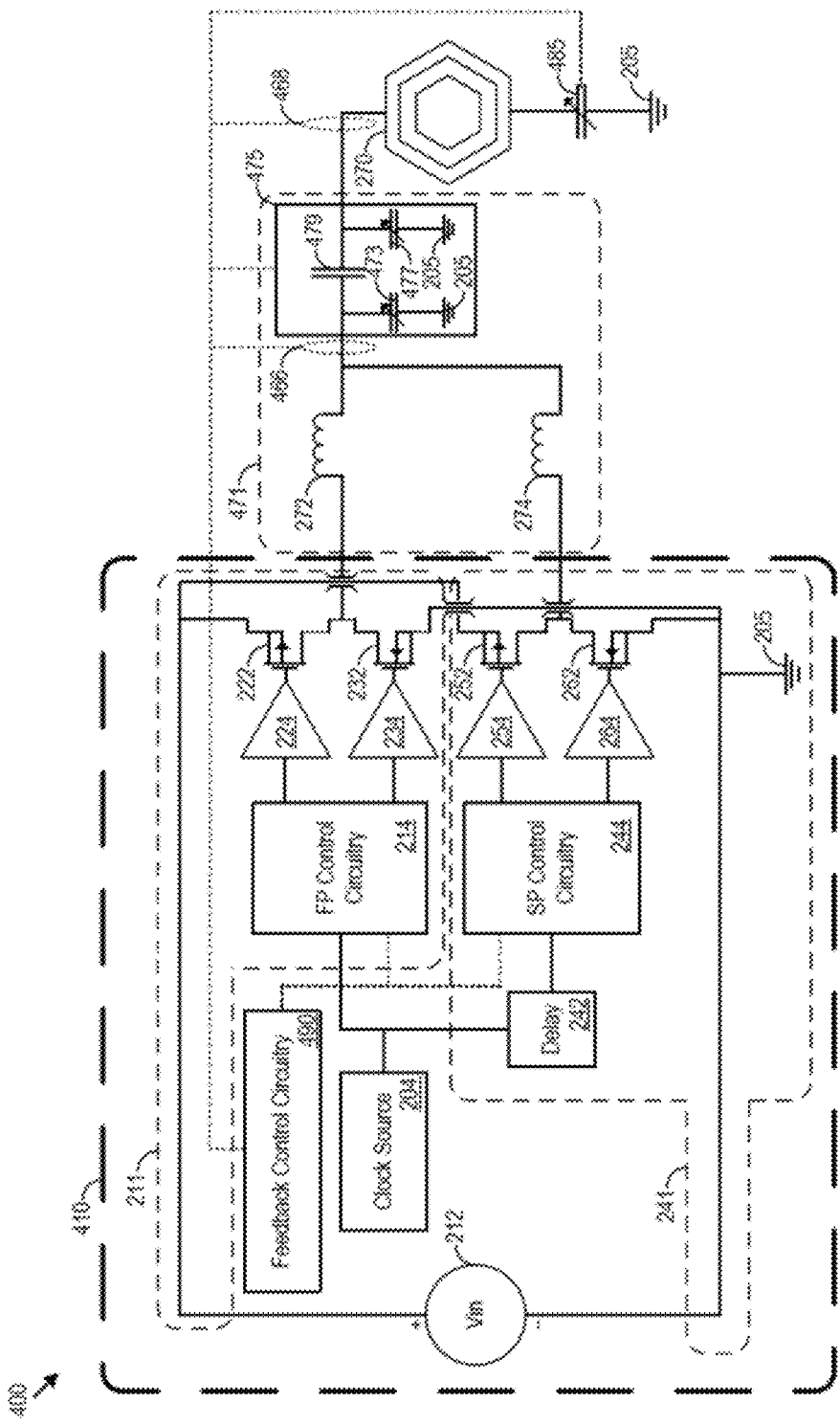
FIG. 4 is a schematic block diagram of example circuitry for wireless power transmission.

FIG. 4 shows example circuitry 400 for wireless power transmission. In some implementations, a matching network 475 may be included in the filter 471 between the power signal source 410. The power signal source 410 may operate similarly to the power signal source 210 of FIG. 2, but may further include feedback control circuitry 490. The feedback control circuitry 490 may be used to determine the phase angle Φ to set between the FP 211 and the SP 241. Additionally or alternatively, the feedback control circuitry 490 may be used to control the matching network 475. The matching network may include variable elements, such as variable capacitors, that may be adjusted. For example, the matching network may include variable parallel capacitors 473, 477, and series capacitor 479. The capacitors 473, 477, 479 may have capacitances C2, C3, and C1, respectively. The variable elements of the matching network 475 may be used to compensate of for the variation in components in the filter 471. Variations may include process, voltage, and temperature variations. The capacitor 485 may include a variable capacitance. The capacitor 485 may be used to compensate for the reactance of the antenna. The capacitor 485 may be a variable capacitor with capacitance Ccomp. In some implementations, the capacitor 485 may be controlled by the feedback control circuitry 490.

In an example implementation, the current ω0 and iload, the current being input into the coil, for the circuitry 400 may be expressed as:

$$\omega 0 = \frac{1}{\sqrt{Linv \cdot \left(C3 + \frac{C1 \cdot C2}{C1 + C2}\right)}} \quad \text{Equation 4}$$

-continued $$iload = \omega 0 \cdot \left(C2 + C3 + \frac{C2 \cdot C3}{C1}\right) \cdot \frac{2}{\pi} \cdot Vin \cdot \cos\left(\frac{\Phi}{2}\right) \quad \text{Equation 5}$$

In various implementations, the feedback control circuitry 490 may operate sensors 466, 468 to measure current and/or other parameters at multiple locations on the circuitry 400. The feedback control circuitry 490 may use the parameter measurement to adjust the angle Φ between the phases of the signals on the paths of the power signal source 410. The feedback control circuitry 490 may also control the matching network 475 based on the measured parameters. Additionally or alternatively, the capacitor 485 may be controlled by the feedback control circuitry based on one or more of the measured parameters. In various implementations, the sensors 466, 468 may measure the phase of the current before and after the matching network 475. As discussed below, the multiple point phase measurement may allow for a low loss or lossless current measurement.

In various implementations, the transconductance of the system, Ysys, and the equivalent inverter capacitor, Cv, of the matching network may be expressed as two different functions of C1, C2, and C3. In some cases, by adjusting C2 and/or C3, Ysys may be modified while Cv is held constant. Additionally or alternatively, Cv may be modified while Ysys is held constant. In various implementations, Cv and Ysys may be expressed as:

$$Cv = C3 + \frac{C1 \cdot C2}{C1 + C2} \quad \text{Equation 6}$$

$$C2e = C2 + C3 + \frac{C2 \cdot C3}{C1} \Rightarrow Ysys = \frac{iLd}{Vin} = \frac{\pi}{2} j \cdot \omega 0 \cdot C2e \quad \text{Equation 7}$$

where iload is the load current. Further, Iinv the current input into the matching network may be expressed as:

$$Iinv = iload \cdot \left(1 + \frac{C1}{C3} + j \cdot \omega 0 \cdot \right.$$

$$\left. C2e\left(j \cdot \omega 0 \cdot Lcoil + RL + j \cdot XL + \frac{1}{j \cdot \omega 0 \cdot Ccomp}\right)\right) \quad \text{Equation 8}$$

where Lcoil is the inductance of the transmit coil, and j is the square root of −1. The expression RL+j*XL represents the reflected impedance from the power receiving unit.

Figure 5:
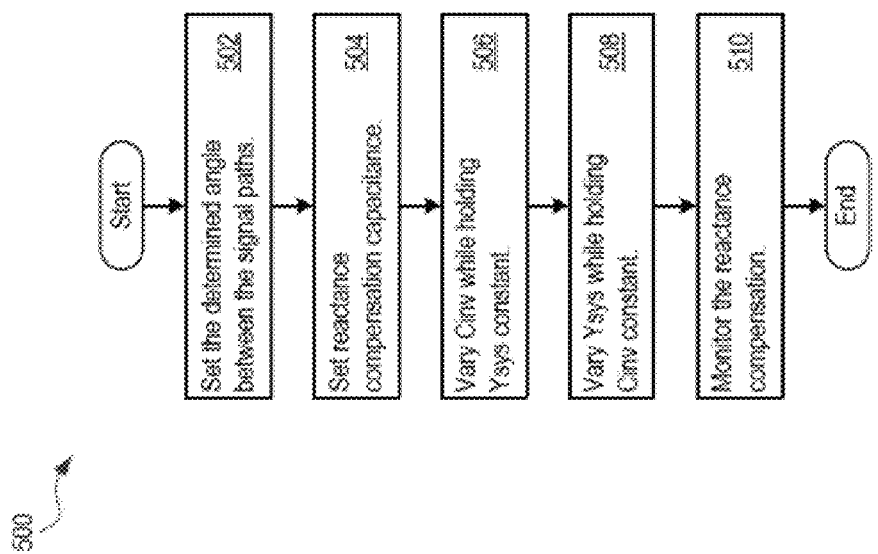
FIG. 5 is a schematic block diagram of example circuitry for reactance compensation.

FIG. 5 shows example logic 500 for reactance compensation. The logic 500 may start by setting a determined angle, Φ0, between the signal paths (502). The determined angle Φ0 may be a default starting value. In some cases, the angle may be selected based at least in part on safety concerns. For example, the angle may be selected to keep heating in the transmit coil below a certain level. The logic may set Ccomp such that the measured phase of the current before the matching network θinv and the phase of the current at the input of the coil θcl are 90 degrees apart (504). The logic 500 may vary Cinv while holding Ysys constant (506). The logic 500 may vary Ysys to locate the point where iload has the minimum derivative with respect to Ccomp.

The logic 500 may vary Ysys while holding Cinv constant (508). The logic 500 may vary Ysys to set the load current iload at a determined value. The determined value of iload may be determined by the application. For example, iLd may be selected based on the charging parameters of a device. The logic 500 may monitor the reactance compensation of the system (510). For example, the logic 500 may implement the logic 600 below to monitor the reactance compensation of the system.

Figure 6:
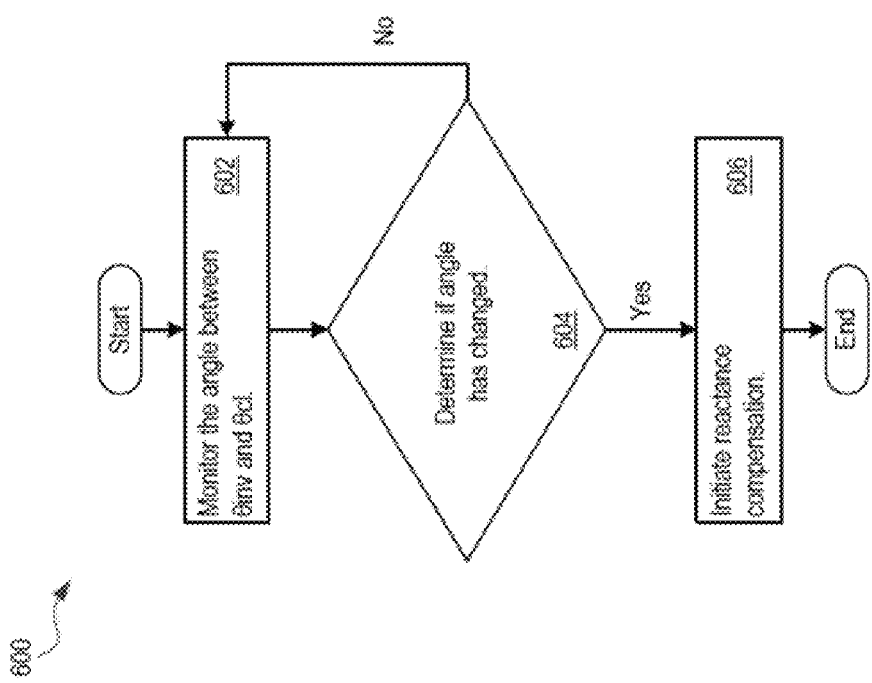
FIG. 6 is a schematic block diagram of example circuitry for reactance compensation monitoring.

FIG. 6 shows example logic 600 for reactance compensation monitoring. The logic 600 may monitor the angle between θinv and θcl (602). For example, the logic 600 may determine if the angle between θinv and θcl has drifted from a value of 90 degrees. The logic may determine if the angle between θinv and θcl has changed such that a compensation process may be initiated (604). For example, the logic 600 may determine if the angle between θinv and θcl differs from 90 degrees more than a determined threshold. Based on the determination, the circuit may initiate compensation (606) or continue monitoring the angle between θinv and θcl (602). For example, the logic 600 may implement the logic 500 to perform reactance compensation. In some implementations, the logic 600 may implement the logic 500 using the current angle between the two paths as the determined angle Φ0.

In some implementations, a resistor may be placed in series with a transmit coil and a ground. The resistor may be used for an Rsensing current measurement. In some cases, Rsensing current measurements may be associated with losses within transmit coil system.

In some cases, the measurement of current within the transmit coil of a wireless power system may be accomplished using the sensors or other detectors used in a phase measurement. The phase measurement sensor may also be used to calibrate a matching network coupled to the transmit coil.

Figure 7:
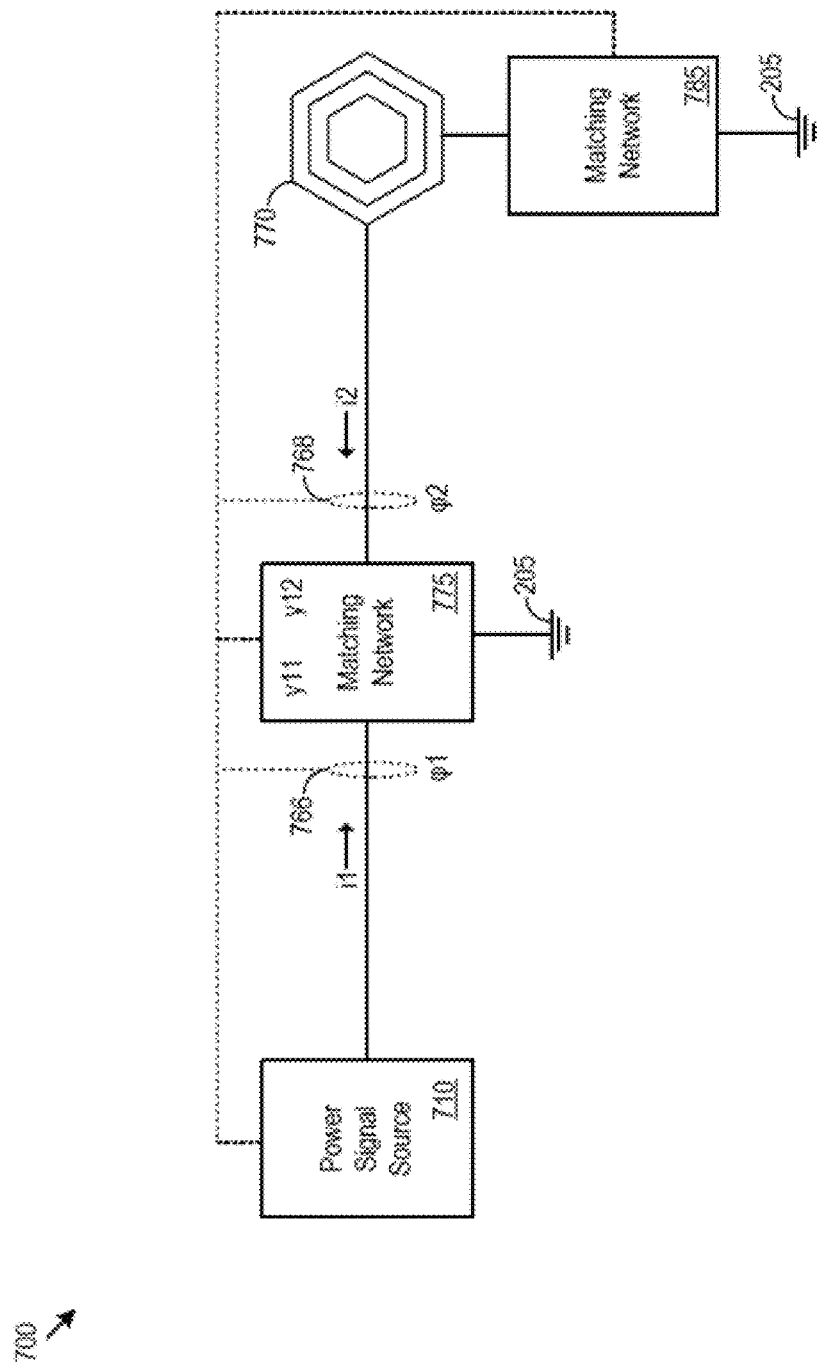
FIG. 7 is a schematic block diagram of example circuitry supporting phase-based current measurement.

FIG. 7 shows example circuitry 700 supporting phase-based current measurement. A power signal source 710 supplies a current signal to the input of a matching network 775. The output of the matching network is coupled to the transmit coil 770. Two phase sensors 766, 768 are placed at the input and output of the matching network. The current, i1, at the input of the matching network is controlled by the signal supply 710. The current at the output of the matching network, i2 may be expressed in terms of i1, the phase angle between the measurement points, φ21, phase of the current at the input to the matching network, φ1.

To calculate the relationship between i1 and i2, parameter angles between impedances y11 and y12 may be used. In various implementations, the relationship between the parameter angles and the currents may be expressed as:

$$i1 = (y11 + y12)\varphi1 + i2, \quad \text{Equation 9}$$

$$\text{where: } y11 = \frac{i1(\varphi2 = 0)}{\varphi1},$$

$$\text{and: } y12 = \frac{i1(\varphi1 = 0)}{\varphi2}.$$

Ccomp, the capacitance used to compensate for the reactance of the transmit coil 770, may be supplied by a second matching network 785. When the circuitry 700 is simplified such that Ccomp is brought into the matching network and resistive and Rsensing elements are removed, the impedances simplify into purely capacitive contributions. The angles between the parameters are then 90 degrees because they represent impedances that are purely imaginary. For the example circuitry 700, the relationship between currents i1 and i2 may be expressed as:

$$i2 = i1 \cdot \frac{\cos(\varphi1)}{\sin(\varphi1 - \varphi21)} \quad \text{Equation 10}$$

Figure 8:
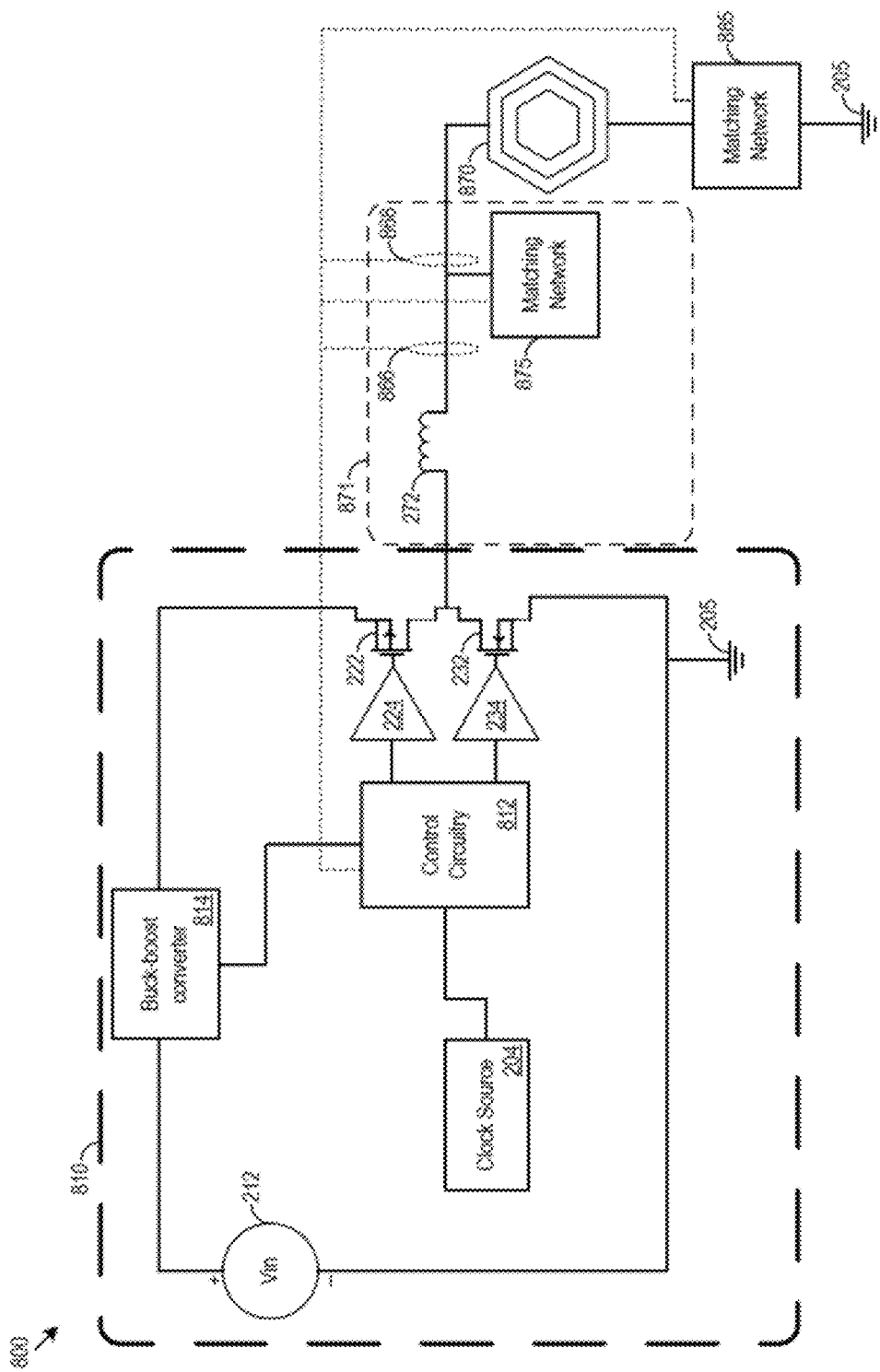
FIG. 8 is a schematic block diagram of example circuitry for wireless power transmission.

FIG. 8 shows example circuitry 800 for wireless power transmission. The circuitry 800 includes a class D power signal supply 810. Phase detectors 866, 868 may supply phase measurements of the current from the input to the matching network 875 and the output of the matching network 875. The phase detectors 866, 868 may provide the measurement of the phase to control circuitry 812. The control circuitry 812, may adjust the output the power signal supply 810 in response to the phase measurements. The matching network 875 may act as a component within a filter 871. The control circuitry 812 may adjust the buck-boost converter 814 to increase or decrease the power signal output of the circuitry 800. The control circuitry 812 may also adjust the voltage output of the converter 814 to compensate for changes in the transmit coil load. The control circuitry 812 may adjust the matching network 875 and the compensation matching network 885 to execute the phase based power measurement. Additionally or alternatively, the control circuitry 812 may adjust the matching network to compensate for the reactance of the transmit coil 870.

In various implementations, the example circuitry 400 may be used to implement the phase based current measurement using sensors 466 and 468. The phase-based current measurement may be implemented with virtually any wireless power transmission systems that use a matching network and a transmit coil.

Figure 9:
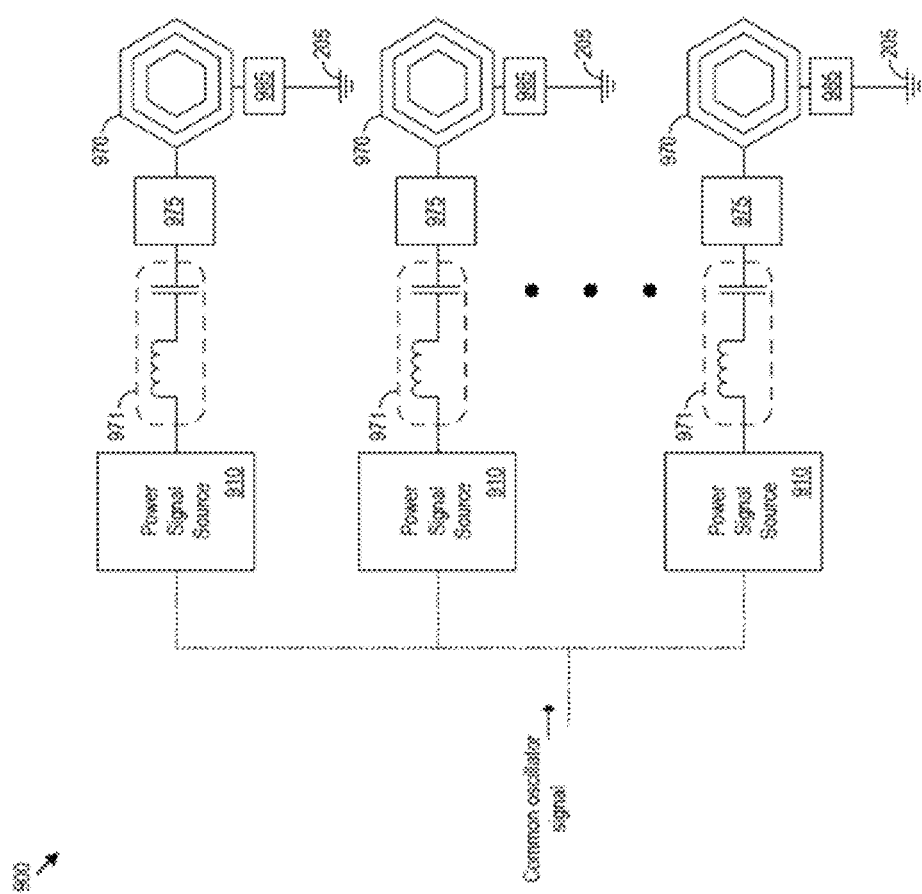
FIG. 9 is a schematic block diagram of example circuitry for wireless power transmission.

FIG. 9 shows example circuitry 900 for wireless power transmission. The example circuitry 900, comprises multiple power signal sources 910, such as power transmission units, and multiple transmit coils 970. The circuitry 900 may further include filters 971 and matching networks 975. The circuitry may also include compensation networks 985 to compensate for the reactances of the coils 970.

In various implementations, the power signal sources 910 may drive the multiple coils synchronously. The power signal sources 910 may use a common oscillator signal and may drive their respective coils at varying phases using the common oscillator signal to maintain a synchronous relationship. The phases of the power signal sources may be selected based on the application of the circuitry 900. For example, the phase relationships may be selected to maximize power transmitted. In another example, the phase relationships may be selected to shape the field generated by the power signal sources. In some cases, the receiving coil of a charging device may not be parallel to the transmit coils 970. The phases may be selected to attempt to align the field for optimal transmission to the receiving coil. In another example, one or more of the power signal source 910 may be deactivated while one or more other power signal sources 910 continue transmitting to control the shape and/or power output of the circuitry 900. In some implementations, the phase relationships of the power signal source 910 may be fixed based on fixed delays within the circuitry 900. In other implementations, the phase relationships between the power signal sources 910 may not be fixed. For example, the phase relationships may be dynamically adjusted using control circuitry.

Figure 10:
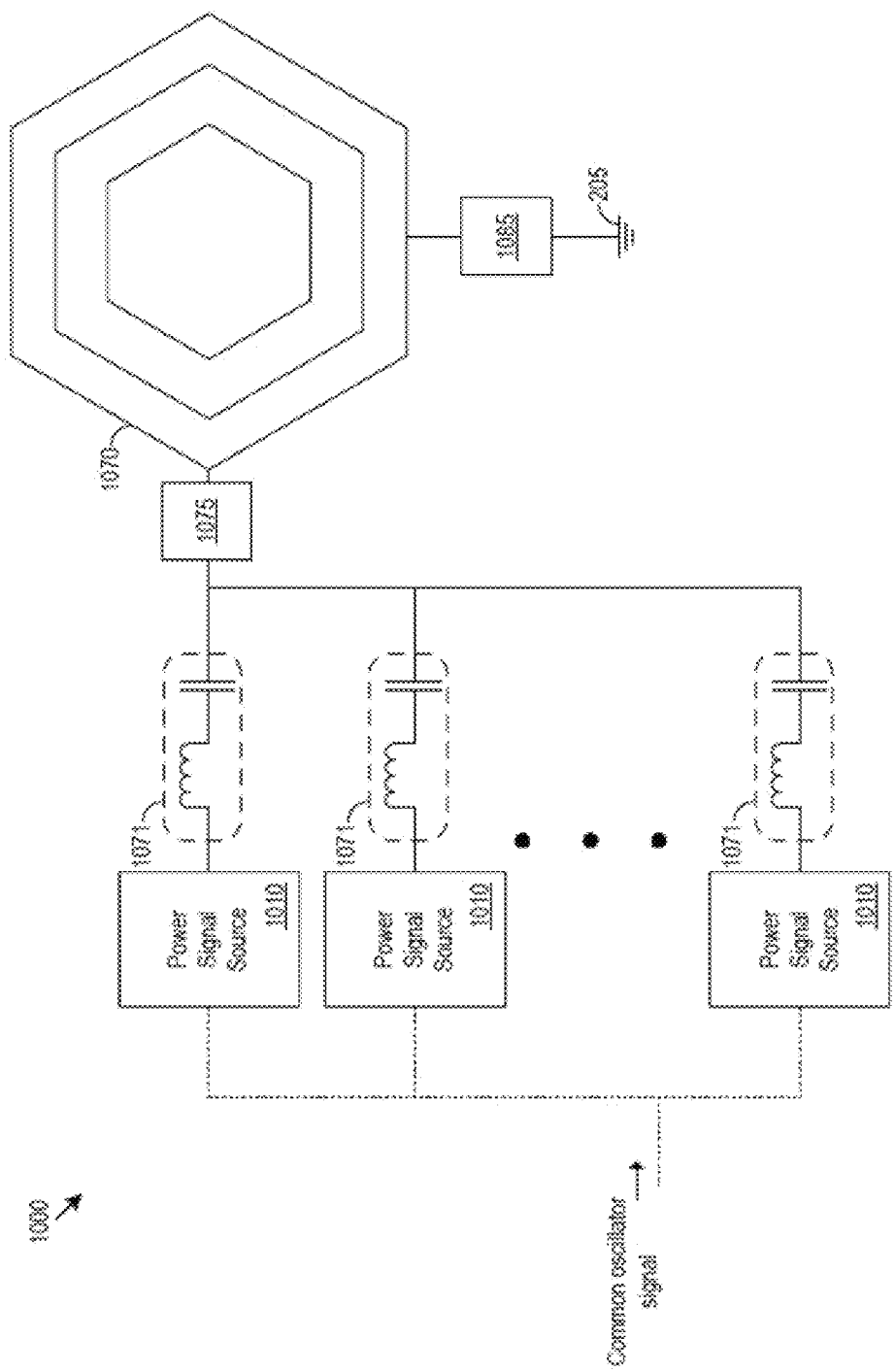
FIG. 10 is a schematic block diagram of example circuitry for wireless power transmission.

FIG. 10 shows example circuitry 1000 for wireless power transmission. The example circuitry 1000, comprises multiple power signal sources 1010, such as power transmission units, and a single coil 1070. The circuitry 1000 may further include filters 1071 and a matching network 1075. The circuitry may also include a compensation network 1085 to compensate for the reactance of the coil 1070.

In various implementations, the power signal sources 1010 may drive the coil 1070 synchronously. Similar to the circuitry 900 above, the phase relationships of the power signal source 1010 in the circuitry 1000 may be determined based on the application of the circuitry 1000.

The use of multiple coils and/or multiple power signal sources may allow for efficient increases in the power transmitted by the one or more coils. Additionally or alternatively, the power usage of individual power signal sources may be reduced for a given peak power. In some cases, reduced power consumption may increase safety, by reducing the heat dissipated, and may reduce the size and/or complexity of the power signal sources. In various implementations, the numbers of power signal source and transmit coils may be generalized to N power signal sources and M coils, where one or more power signal source is provided per coil. The N power signal sources may be drive synchronously. In some implementations, the N power signal sources may be able to deliver N times the power of a single power signal source for a given signal source design. In various implementations, different power signal source types may be used. For example class D, class E, parallel sources, such as those of circuitry 200, 400, and/or other power signal sources may be used.

Figure 11:
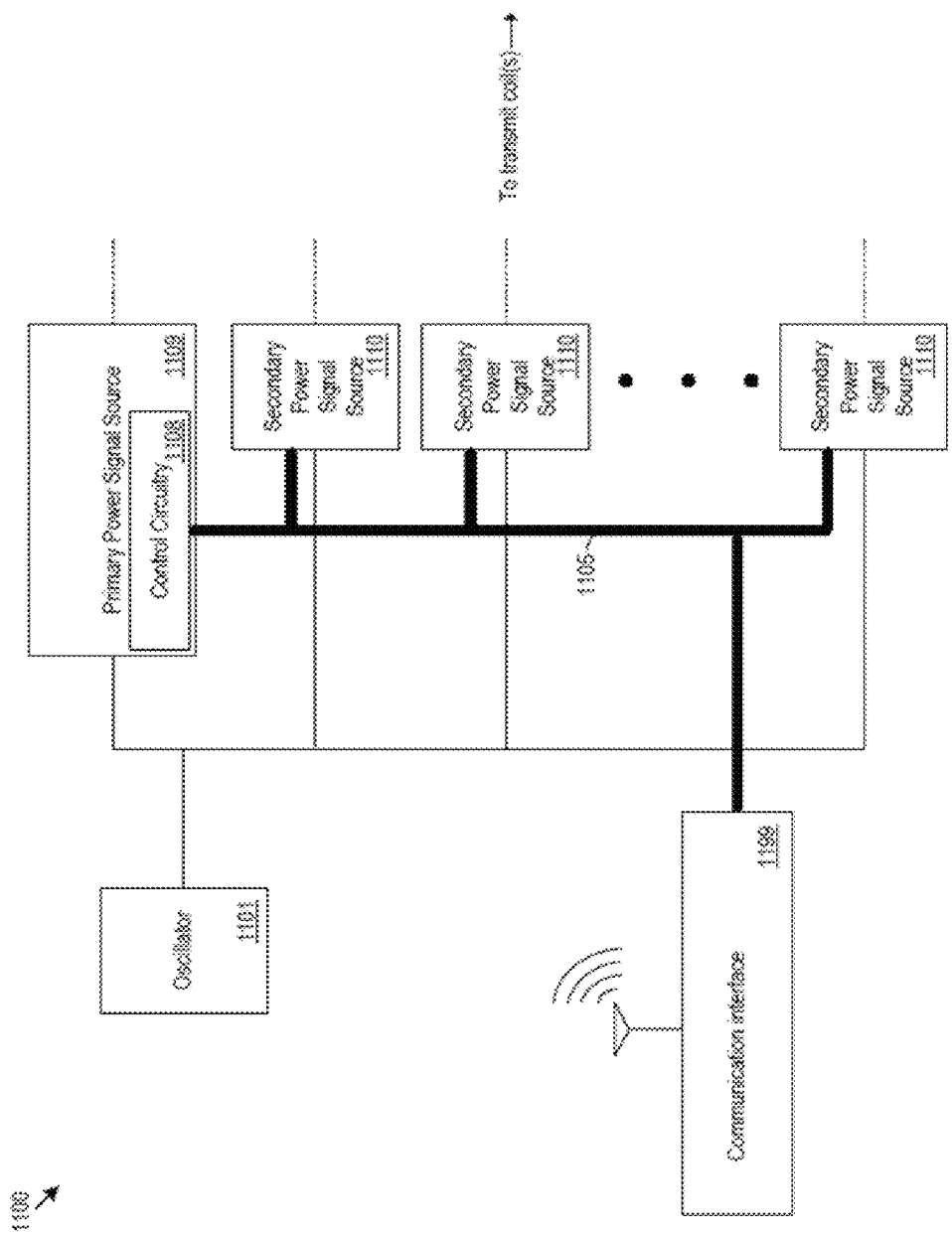
FIG. 11 is a schematic block diagram of example circuitry for synchronous control of multiple power signal sources.

FIG. 11 shows example circuitry 1100 for synchronous control of multiple power signal sources. The example circuitry may include a bus 1105 between the secondary power signal sources 1110 and a primary power signal source 1109. An oscillator 1101 may provide a common clock signal to the power signal sources 1110, 1109. A control circuitry 1108 in the primary power signal source 1109 may receive phase information, current information, load information, and/or other information from the secondary signal sources 1110 over the bus 1105. The control circuitry 1108 may transmit control information over the bus 1105 to the secondary signal sources 1110 to adjust their phase relationships. Additionally or alternatively, the control circuitry 1108 may activate and deactivate the power signal sources 1110, 1109. For example, power signal sources 1110, 1109 may be activated or deactivated depending on their respective loads. The power signal sources 1110, 1109 may include sensors to collect phase information. For example, the power signal sources may include phase sensors to collect phase information. In various implementations, the secondary power signal source may collect phase information at the inputs of their respective coils. Additionally or alternatively, in implementations where multiple power signal sources drive a single coil, the power signals sources 1110, 1109 may collect phase information at the input to the matching network of the coil. In various implementations, phase information may be collected at the input of the match network of a coil and the input to the coil for the power signal sources 1110, 1109. Collection of phase information at both the input and output of one or more matching networks may allow for current measurements in addition phase measurements. Current and phase information may be sent to the control circuitry 1108.

In some implementations, the circuitry 1100 may include a communication interface 1199 that may allow communication with a receiving device. For example, the communication interface 1199 may communicate over Bluetooth or another wireless protocol with the receiving device. The communication interface 1199 may receive application information from the receiving device. Application information may include receiving coil size, orientation information (such as accelerometer measurements and/or other orientation information), power consumption information, current demands, requests for transmitted power level adjustments, indications of charging status, and/or other application information. The communication interface 1199 may transmit the application information to the control circuitry 1108.

In some implementations, the control circuitry 1108 may implement foreign object detection based on load. For example, one or more power signal sources 1110, 1109 may be switched on or off based on a change in the load of a transmit coil. For example, the one or more power signal source associated with transmit coil may be switched of in response to a change in the load of the transmit coil when no information is received over the communication interface identifying the source of the change in the load. This may protect foreign objects from being exposed to transmitted power signals. Additionally or alternatively, some coils may remain active while others are switched off. The powering down of the coils may be localized to those with load changes reducing potential interruption to device charging and/or other transmit processes.

Figure 12:
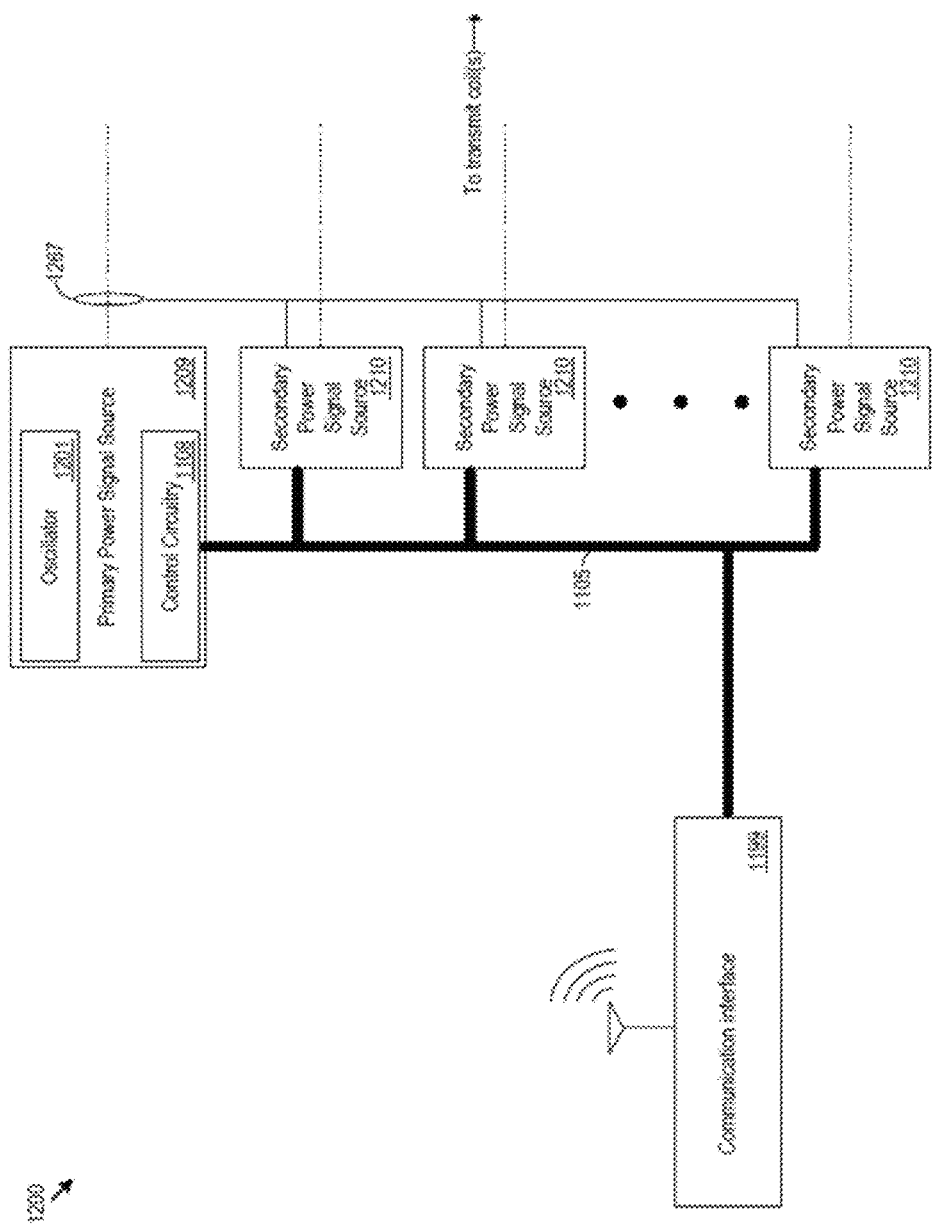
FIG. 12 is a schematic block diagram of example circuitry for synchronous control of multiple power signal sources.

FIG. 12 shows example circuitry 1200 for synchronous control of multiple power signal sources. In the example circuitry 1200, the oscillator 1201 may be combined with the primary power signal source 1209. The secondary power signal sources 1210 may receive their common clock signals from a sensor 1267 that recovers the clock signal from the output of the primary power signal source 1209.

Figure 13:
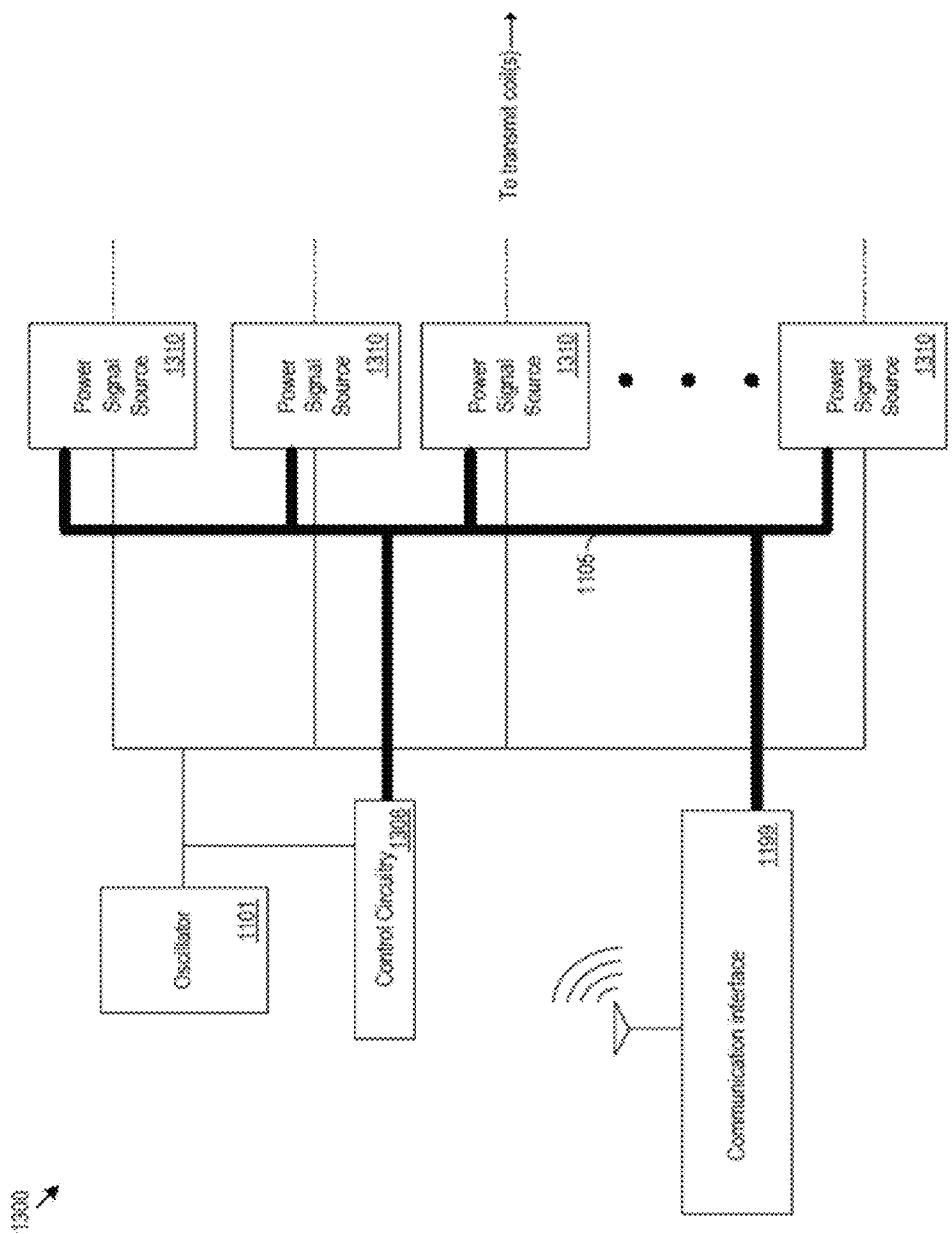
FIG. 13 is a schematic block diagram of example circuitry for synchronous control of multiple power signal sources.

FIG. 13 shows example circuitry 1300 for synchronous control of multiple power signal sources. In the example circuitry 1300, the control circuitry 1308 may be separated from the power signal sources 1310. The control circuitry 1308 may receive information from the power signal sources over the bus 1105 and may transmit control information to the power signal sources 1310. The power signal sources 1310 need not include primary and/or secondary designations.

Figure 14:
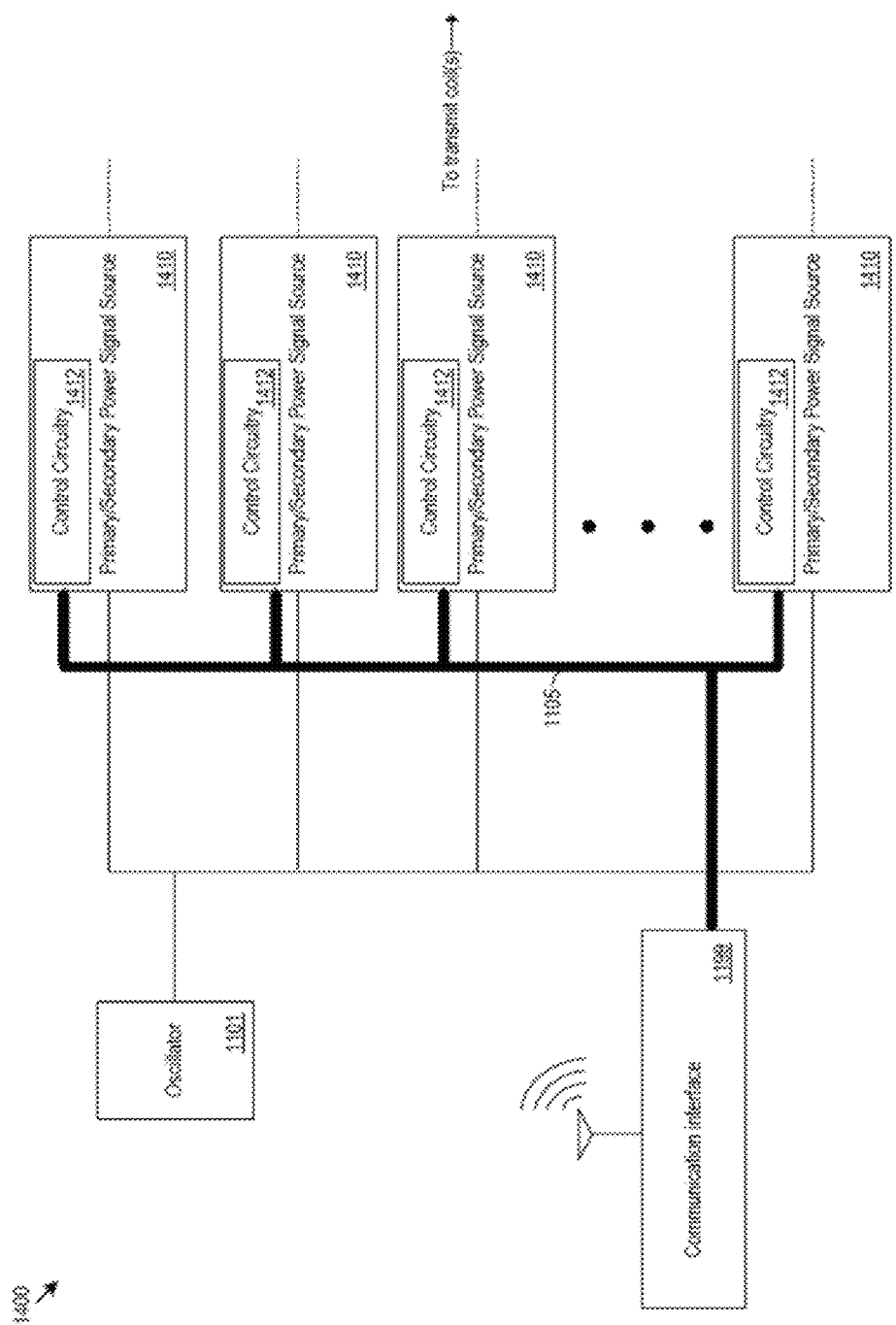
FIG. 14 is a schematic block diagram of example circuitry for synchronous control of multiple power signal sources.

FIG. 14 shows example circuitry 1400 for synchronous control of multiple power signal sources. In the example circuitry 1400, the primary/secondary power signal sources 1410 may include control circuitry 1412. The designation of primary power signal source may be changed during operation and/or design of the circuitry 1400.

While the foregoing description has focused on has sensing and control within a power transmitting unit to improve power transfer and efficiency, in other examples, the power receiving unit and power transmitting unit can, in addition or in the alternative, exchange control data in order to cooperatively improve power transfer and efficiency. Such further examples are discussed in conjunction with FIGS. 15-19 that follow.

Figure 15:
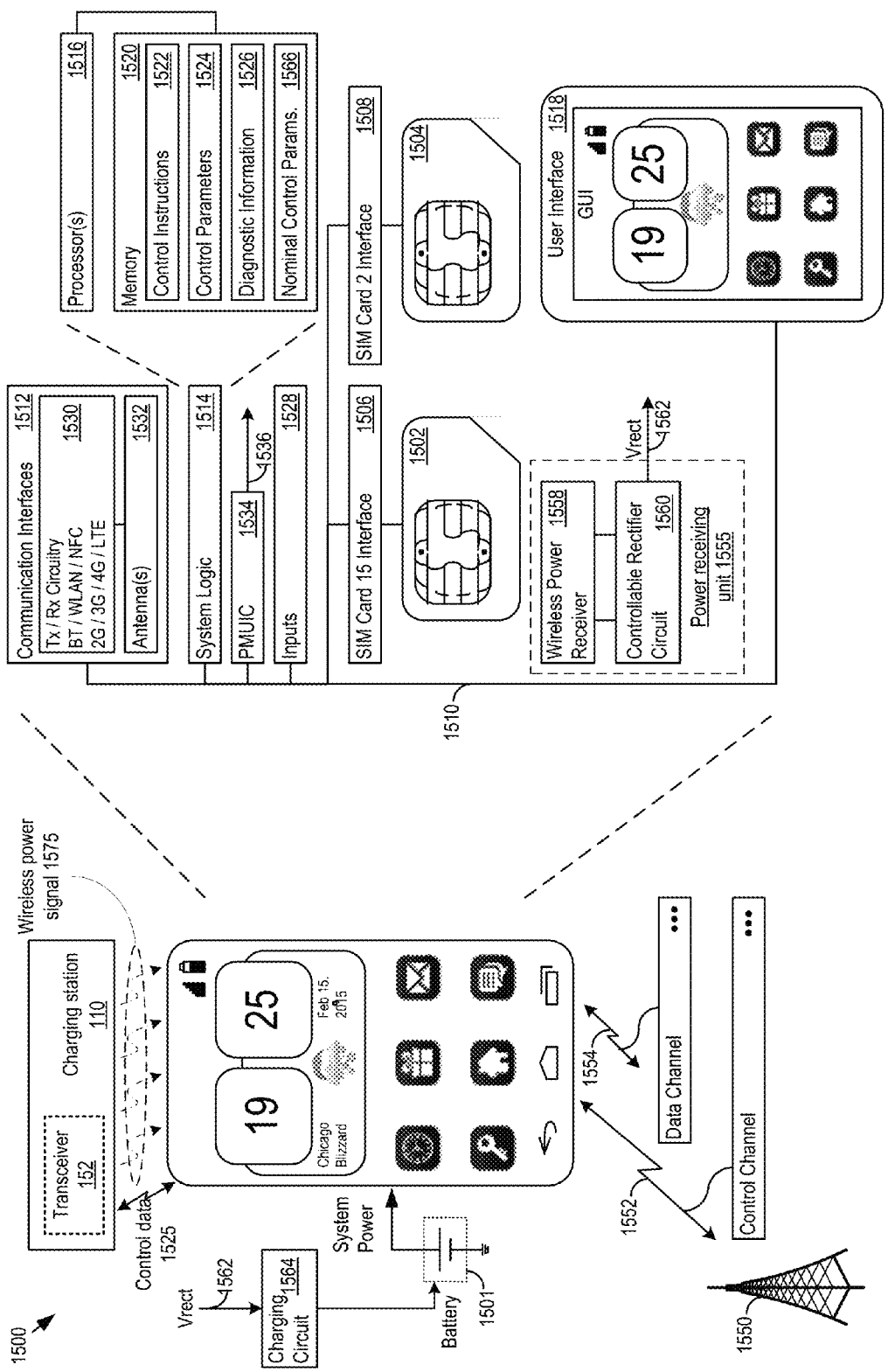
FIG. 15 is a schematic block diagram of an embodiment of a wireless communication device.

FIG. 15 is a schematic block diagram of an embodiment of a wireless communication device. A wireless communication device 1500 is shown such as a 2G, 3G, or 4G/LTE smartphone capable of making and receiving wireless phone calls, and transmitting and receiving data using 802.11 a/b/g/n/ac/ad ("WiFi"), Bluetooth (BT), Near Field Communications (NFC), or any other type of wireless technology. In addition to making and receiving phone calls and transceiving data, the wireless communication device 1500 optionally runs any number or type of applications. The wireless communication device 1500 may draw energy from numerous different sources. As one example, the wireless communication device 100 may draw energy from the battery 1501. Other sources of energy include Wireless Power Transfer (WPT) energy sources such as charging station 110. In that respect, described further below are techniques for harvesting power from wireless signals.

The wireless communication device 1500 is shown as a smartphone in this example, but the functions and features described herein can likewise be implemented in other host devices such as a laptop, tablet, cellphone, a peripheral host device such as a keyboard, a mouse, a printer, a microphone, headset, headphones, speakers or other peripheral, a driver assistance module in a vehicle or other vehicle based device, an emergency transponder, a pager, a watch including a smart watch, a satellite television receiver, a stereo receiver, music player, home appliance and/or any electronic host device that is compatible with wireless charging or other wireless power transfer.

In the embodiment shown, the wireless communication device 1500 communicates with a network controller 1550, such as an enhanced Node B (eNB) or other base station. The network controller 1550 and wireless communication device 1500 establish communication channels such as the control channel 1552 and the data channel 1554, and exchange data. The wireless communication device 1500 may be exposed to many other sources of wireless signals as well, e.g., from a charging station 110 or other power transmitting unit (PTU), and wireless signals may be harvested in conjunction with the WPT techniques described herein.

In the embodiment shown, the wireless communication device 1500 supports one or more Subscriber Identity Modules (SIMs), such as the SIM1 1502 and the SIM2 1504. Electrical and physical interfaces 1506 and 1508 connect SIM1 1502 and SIM2 1504 to the rest of the user equipment hardware, for example, through the system bus 1510.

The wireless communication device 1500 includes communication interfaces 1512, system logic 1514, and a user interface 1518. The system logic 1514 may include any combination of hardware, software, firmware, or other logic. The system logic 1514 may be implemented, for example, with one or more systems on a chip (SoC), application specific integrated circuits (ASIC), one or more processors, discrete analog and digital circuits, and other circuitry. The system logic 1514 is part of the implementation of any desired functionality in the wireless communication device 1500.

The system logic 1514 may further facilitate, as examples, decoding and playing music and video, e.g., MP3, MP4, MPEG, AVI, FLAC, AC3, or WAV decoding and playback; running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 1518. The user interface 1518 and the inputs 1528 may include a graphical user interface (GUI), touch sensitive display, voice or facial recognition inputs, buttons, switches, speakers and other user interface elements. Additional examples of the inputs 1528 include microphones, video and still image cameras, temperature sensors, vibration sensors, rotation and orientation sensors, headset and microphone input/output jacks, Universal Serial Bus (USB) connectors, memory card slots, radiation sensors (e.g., IR sensors and/or other sensors), and other types of inputs.

The system logic 1514 may include one or more processors 1516 and memories 1520. The memory 1520 stores, for example, control instructions 1522 that the processor 1516 executes to carry out desired functionality for the wireless communication device 1500. The control parameters 1524 provide and specify configuration and operating options for the control instructions 1522. The memory 1520 may also store any BT, WiFi, 3G, or other data 1526 that the wireless communication device 1500 will send, or has received, through the communication interfaces 1512. The wireless communication device 1500 may include a power management unit integrated circuit (PMUIC) 1534. In a complex device like a smartphone, the PMUIC 1534 may be responsible for generating, e.g., thirty (30) different power supply rails 1536 for the circuitry in the wireless communication device 1500.

In the communication interfaces 1512, Radio Frequency (RF) transmit (Tx) and receive (Rx) circuitry 1530 handles transmission and reception of signals through one or more antennas 1532. The communication interface 1512 may include one or more transceivers. The transceivers may be wireless transceivers that include modulation/demodulation circuitry, digital to analog converters (DACs), shaping tables, analog to digital converters (ADCs), filters, waveform shapers, filters, pre-amplifiers, power amplifiers and/or other logic for transmitting and receiving through one or more antennas, or (for some devices) through a physical (e.g., wireline) medium.

As just one of many possible implementation examples, the wireless communication device 1500 may include (e.g., for the communication interface 1512, system logic 1514, and other circuitry) a BCM59351 charging circuit, BCM2091 EDGE/HSPA Multi-Mode, Multi-Band Cellular Transceiver and a BCM59056 advanced power management unit (PMU), controlled by a BCM28150 HSPA+ system-on-a-chip (SoC) baseband smartphone processer or a BCM25331 Athena™ baseband processor. These devices or other similar system solutions may be extended as described below to provide the additional functionality described below. These integrated circuits, as well as other hardware and software implementation options for the wireless communication device 1500, are available from Broadcom Corporation of Irvine Calif.

The charging station 110 or another power transmitting unit may generate a wireless power signal 1575. A controllable rectifier circuit 1560 receives the wireless power signal via a wireless power receiver 1558. The output of the controllable rectifier circuit 1560 is the wireless power output signal 1562, Vrect, that can be used by charging circuit 1564 to charge a battery 1501 of the wireless communication device 1500 and/or to provide other system power.

In various embodiments, the controllable rectifier circuit 1560 includes a rectifier having a switching circuits configured to generate a rectified voltage, Vrect, from the wireless power signal, based on switch control signals that include a switch-on signal and a switch-off signal for each switching circuit. A rectifier control circuit generates the switch control signals that generate a rectifier duty cycle that depends on the current loading conditions. In addition, the system logic 1514 may exercise control over controllable rectifier circuit. In particular, one or more processors 1516 can execute control instructions 1522 to change switching parameters that affect the switch timing and rectifier duty cycle of the controllable rectifier circuit 1560. In addition, the memory 1520 may also store nominal control parameters 1566. The nominal control parameters 1566 may set or alter switching timing for the controllable rectifier circuit 1560 for predefined operating scenarios of the wireless communication device 1500. For example, the switch timing and rectifier duty cycle may vary based on changes in load and can differ in scenarios such as during startup of the wireless communication device 1500, during normal operation of the wireless communication device 1500, during high power or low power consumption of the wireless communication device 1500 (or any other power consumption mode as determined by comparison of current power consumption against one or more power thresholds), or during any other pre-defined operating scenarios. In some implementations, the nominal control parameters 1566 may be stored in a One Time Programmable (OTP) memory, with the nominal control parameters 1566 determined, e.g., during a factory calibration process.

It should be noted that changes in the rectifier duty cycle can cause variations in the impedance reflected back to the power transmitter circuitry of the charging station 110. When a rectifier of the controllable rectifier circuit 1560 is "switched-on", the load impedance may appear as predominately resistive, while when the rectifier of the controllable rectifier circuit 1560 is "switched-off", the load impedance may appear as predominately capacitive. These time-varying impedances are filtered by the receive and transmit coils into a more slowly time varying quantity because the narrow bandwidth of these coils operates to filter the higher order harmonics produced by sharp transitions of this switching, while maintaining the fundamental frequency. Nevertheless, variations in rectifier duty cycle can lead to variations in transmitter impedance that can cause further impedance mismatches that reduce power transfer and efficiency.

As previously discussed, the power receiving unit 1555 and charging station 110 exchange control data 1525 in order to cooperatively establish a charging session, and further to improve power transfer and efficiency. In the embodiment shown, the power receiving unit 1555 wirelessly couples with the transceiver 152 of a PTU such as charging station 110, via a wireless radio unit included in transmit/receive circuitry 1530 or a dedicated wireless radio unit included in power receiving unit 1555. The transmit/receive circuitry 1530 or a dedicated wireless radio unit operate under control of the system logic 1514 or a dedicated processor of PRU 1555 to establish the wireless connection with the charging station 110 via a connection establishment procedure and further to exchange control data 1525 with the charging station 110 via the wireless connection.

In one example of operation, charging station 110 and PRU 1555 operate in accordance with a loosely coupled wireless power transfer specification such as the A4WP baseline system specification 1.0 (BSS 1.0), however the Wireless Power Consortium (WPC) Qi low power specification or other wireless power transfer standards can likewise be employed. In one example of operation, the wireless power signal 1575 is a 6.78 MHZ signal is sent from the charging station 110 and PRU 1555 to transfer energy to charge the wireless communication device in conjunction with a charging session. Control data 1525 is exchanged between the charging station 110 and PRU 1555 via a 2.4 GHz Bluetooth LE compatible link to control the power transfer from the charging station 110 to the PRU 1555. While described above in conjunction with a BLE wireless control channel between the charging station 110 and PRU 1555, other wireless control channels using other wireless standards and/or load modulation of the wireless power signal 1575 can likewise be employed.

In various embodiments, the control data 1525 includes an indication of the current rectifier duty cycle that is sent to the charging station 110 and can be used to adjust the transmit impedance to compensate, for example, for the current loading conditions. In particular, changes in rectifier impedance caused by duty cycle variations can be estimated based on techniques that will be described in greater detail in conjunction with FIGS. 20-22 and used by the charging station 110 to compensate.

In another example, the charging station 110 can transmit a desired rectifier duty cycle to the PRU 1555 to improve power transfer and the controllable rectifier circuit 1560 can adjust its switch timing to achieve the rectifier duty cycle requested by the charging station 110. In other embodiments, charging data 1525 can be exchanged between the charging station 110 and the PRU 1555 as part of an iterative procedure to adjust the rectifier duty cycle until power transfer is optimized, a desired level of impedance matching occurs and/or other performance goals are reached.

Further embodiments describing the operation of the charging station 110 and the power receiving unit 1555, including numerous optional functions and features, are presented in conjunction with FIGS. 16-22 that follow.

Figure 16:
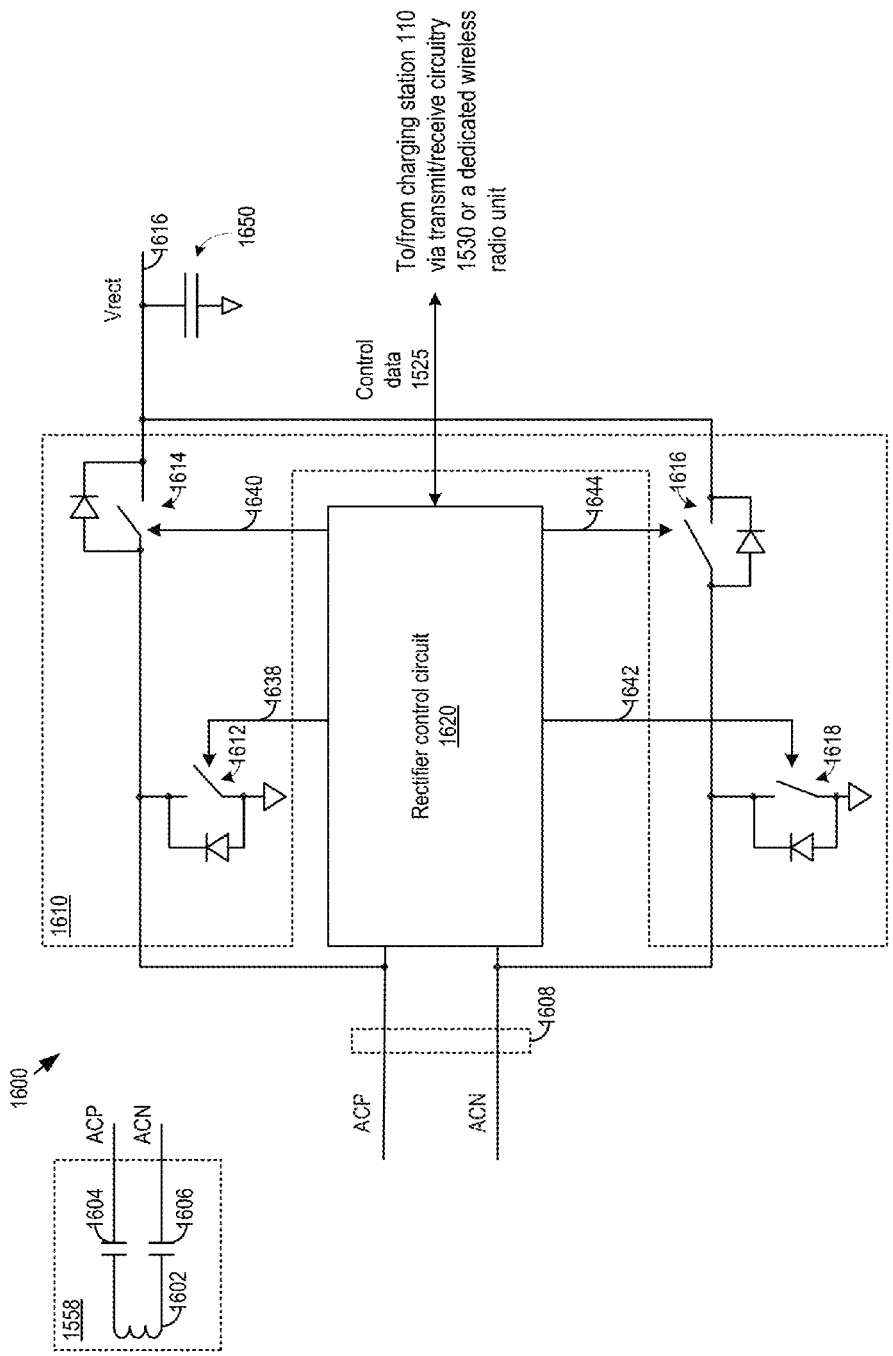
FIG. 16 is a schematic block diagram of an embodiment of components of a wireless charging system.

FIG. 16 is a schematic block diagram 1600 of an embodiment of components of a wireless charging system. As just one example, the rectifier circuit 1610 may harvest 6.78 MHz Alliance for Wireless Power (A4WP) power transmissions. The rectifier circuit 1610 facilitates efficiency improvements in receiving the transmitted energy and delivering it (e.g., as the rectified Direct Current (DC) voltage Vrect) to subsequent energy consuming stages in the device, such as a battery charging circuit 1564 for the battery 1501.

Wireless power transmission suffers from efficiency losses at several stages, e.g., from converting a power source into a radio frequency (RF) wireless power signal transmission, receiving the RF flux of the wireless power signal, and converting the RF flux into a usable DC voltage in the receiving device. The wireless power receiver 1558 employs magnetic resonance achieved through matching the inductance 1602 and capacitance 1604 and 1606 to the transmitter system to obtain a high Q receiver that is very responsive to the fundamental frequency (e.g., 6.78 MHz) of the wireless power signal.

In that regard, the inductance 1602 may be a coil that receives the flux of the wireless power signal. The inductance 1602 may be, for example, one or more turns of a conductor on a printed circuit board, or another type of antenna. The inductance 1602 produces an Alternating Current (AC) current and the capacitance 1604 and 1606 are tuned with respect to the inductance 1602 to achieve the resonance that results in substantial responsiveness to the wireless power signal. The wireless power receiver 1558 provides the AC current into the rectifier circuit 1610, represented in FIG. 16 as a wireless power signal 1608 such as an AC current signal represented by AC Positive (ACP)/ AC Negative (ACN).

The rectifier circuit 1610 operates under control of the rectifier control circuit 1620 to convert the AC current into the DC voltage, Vrect. In one implementation, the rectifier circuit 1610 and rectifier control circuit 1620 are integrated into an integrated circuit chip, though in other implementations discrete components may be used. The rectifier circuit 1610 includes switching circuits (e.g., switching circuits 1612, 1614, 1616, and 1618) arranged to rectify the wireless power input signal to provide a wireless power output signal 1620. The switching circuits 1612, 1614, 1616, and 1618 may be Metal Oxide Semiconductor FETs (MOSFETs), for example, or other types of transistors or other types of switches.

FIG. 16 shows diodes associated with each of the switching circuits 1612, 1614, 1616, and 1618 such as body diodes associated with FET implementations of these switching circuits. The body diodes may have relatively poor conductivity, such that even if the FETs turn on after the body diodes become conductive, the body diodes do not significantly affect the impedance tuning of the rectifier circuit 1610. In other implementations, switches without body diodes may be used. For example a FET switching structure including cascode connected transistors may implement the switches.

Rectifier control circuit 1620 controls the switching circuits 1612, 1614, 1616, and 1618 using switch control signals 1638, 1640, 1642, and 1644 to generate a wireless power output signal 1620, Vrect, as a full wave rectified version of the wireless power input signal 1608 that is filtered by capacitor 1650 into a substantially constant DC voltage—e.g. a DC voltage with acceptable variations or ripple. The switch control signals 1638, 1640, 1642, and 1644 include a switch-on signal and a switch-off signal to individually control the ON and OFF states of each of the switching circuits to provide efficient rectification.

The rectifier control circuit 1620 generates the switch control signals 1638, 1640, 1642, and 1644 that generate a rectifier duty cycle that depends on the current load. The rectifier control circuit 1620 can include a processor or other circuitry that operates at high frequencies (above 1 MHz) and uses of high bandwidth/low propagation delay comparators to sense when to turn on and off the power FETs in the H-bridge. Wireless power systems are typically designed to operate at a fixed (A4WP) or slowly varying (WPC) frequency. In this fashion, the rectifier control circuit 1620 can control the rectifier duty cycle to a nominal value that depends on the load conditions at the time.

In other examples, the system logic 1514, a processor or other circuitry may be used to implement the rectifier control circuit 1620. In particular, one or more processors 1516 can execute control instructions 1522 to change switching parameters that affect the switch timing and rectifier duty cycle of the controllable rectifier circuit 1560. In addition, the memory 1520 may also store nominal control parameters 1566. The nominal control parameters 1566 may set or alter switching timing for the controllable rectifier circuit 1560 for pre-defined operating scenarios of the wireless communication device 1500. For example, the switch timing and rectifier duty cycle may vary based on changes in load and can differ in scenarios such as during startup of the wireless communication device 1500, during normal operation of the wireless communication device 1500, during high power or low power consumption of the wireless communication device 1500 (or any other power consumption mode as determined by comparison of current power consumption against one or more power thresholds), or during any other pre-defined operating scenarios. In some implementations, the nominal control parameters 1566 may be stored in a One Time Programmable (OTP) memory, with the nominal control parameters 1566 determined, e.g., during a factory calibration process. Long term, as load power increases and decreases, delay timing will change resulting in differing value of rectifier duty cycles, but short term (over the span of several carrier clock cycles) the timing remains relatively constant.

In one example of operation, the rectifier control circuit 1620 generates control data 1525 that indicates the current rectifier duty cycle. The transmit/receive circuitry 1530 or a dedicated wireless radio unit sends the control data 1525 to the charging station 110 for use by the charging station 110 to adjust a transmit impedance.

In another operation, the transmit/receive circuitry 1530 or a dedicated wireless radio unit receives control data 1525 from the charging station 110 that is used by the rectifier control circuit 1620 to adjust the switch control signals 1638, 1640, 1642, and 1644. For example the control data 1525 received from the charging station 110 can includes a new rectifier duty cycle and the rectifier control circuit 1620 can adjust the switch control signals 1638, 1640, 1642, and 1644 to achieve the new rectifier duty cycle specified by the charging station. In this fashion, the charging station can specify a specific rectifier duty cycle or recommended adjustments to the current rectifier duty cycle in order to try to correct for an impedance mismatch or otherwise to improve the power transfer of efficiency.

In other examples, the control data 1525 received from the charging station 110 includes transmitter performance data such as transmit power, transmitter impedance mismatch or other transmitter performance data that can be used by the rectifier control circuit 1620 to adjust the switch control signals 1638, 1640, 1642, and 1644 in an attempt to improve the transmitter performance. For example, the charging station 110 can iteratively send control data 1525 that includes periodic updates to the transmitter performance data and the rectifier control circuit 1620 can operate via a control loop or search algorithm based on this feedback to iteratively adjust the switch control signals 1638, 1640, 1642, and 1644 to arrive at the switch control signals 1638, 1640, 1642 and/or a rectifier duty cycle that results in the best transmitter performance under the current load conditions.

Figure 17:
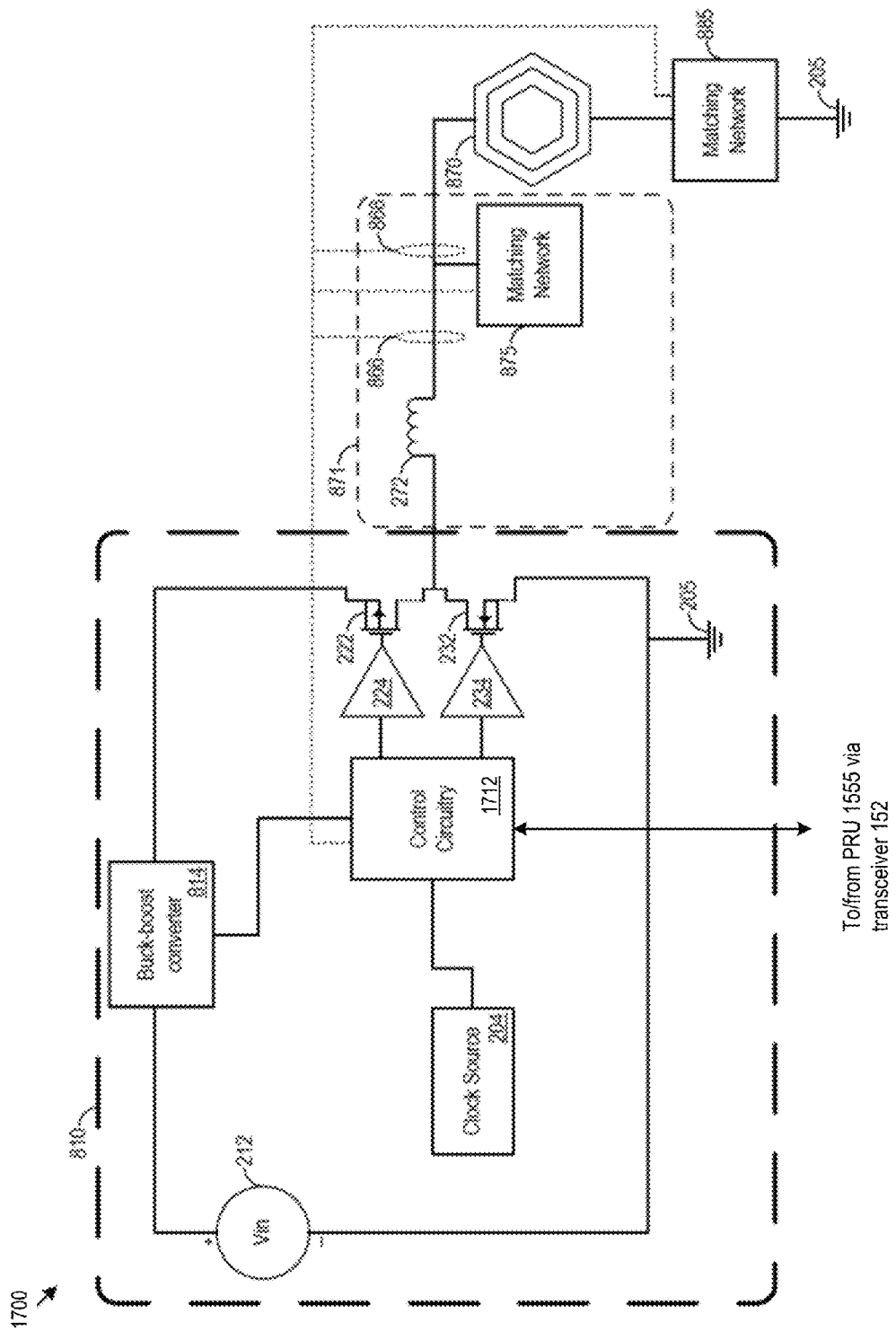
FIG. 17 is a schematic block diagram of example circuitry for wireless power transmission.

FIG. 17 shows example circuitry 1700 for wireless power transmission. In particular, the circuit includes many common elements described in conjunction with FIG. 8 that are referred to by common reference numerals. The circuitry 1700 includes a class D power signal supply 810. Phase detectors 866, 868 may supply phase measurements of the current from the input to the matching network 875 and the output of the matching network 875. The phase detectors 866, 868 may provide the measurement of the phase to control circuitry 1712.

The control circuitry 1712 can include any of the functions associated with control circuitry 812 presented in conjunction with FIG. 8. In particular, control circuitry 1712 may adjust the output the power signal supply 810 in response to the phase measurements. The matching network 875 may act as a component within a filter 871. The control circuitry 1712 may adjust the buck-boost converter 814 to increase or decrease the power signal output of the circuitry 800. The control circuitry 1712 may also adjust the voltage output of the converter 814 to compensate for changes in the transmit coil load. The control circuitry 1712 may adjust the matching network 875 and the compensation matching network 885 to execute the phase based power measurement. Additionally or alternatively, the control circuitry 1712 may adjust the matching network to compensate for the reactance of the transmit coil 870.

In addition, or in the alternative, the control circuitry 1712 receives control data 1525 from the PRU 1555 that indicates the rectifier duty cycle and further may adjust the buck-boost converter 814 to increase or decrease the power signal output of the circuitry 800, adjust the voltage output of the converter 814, may adjust the matching network 875 and/or may adjust the matching network to compensate for changes in the impedance of the transmit coil 870 caused by current the rectifier duty cycle, adjust to reduce transmitter impedance mismatches, and/or to otherwise improve power transfer. In various embodiments, the control circuitry can determine an estimated or average rectifier impedance based on the current rectifier duty cycle and implement adjustments to the matching network to compensate. A specific methodology for modeling rectifier impedance as a function of rectifier duty-cycle is presented in conjunction with FIGS. 20-22 that follow.

In addition or in the alternative, the control circuitry 1712 may also use phase detectors 866, 868 to indicate an amount of impedance mismatch that can be used as transmitter performance data to generate control data 1525 to be sent to the PRU 1555 in an attempt to improve transmitter performance. The control circuitry 1712 may also monitor transmit power, power efficiency or other transmitter performance data that can also be used to generate control data 1525 to be sent to the PRU 1555 to make in an attempt to improve transmitter performance.

In addition or in the alternative, the control circuitry 1712 may also include a look-up table, control algorithm or circuitry to generate control data 1525 to indicate a specific desired rectifier duty cycle. The control circuitry 1712 can iteratively and/or periodically send control data 1525 that includes periodic updates to the transmitter performance data that the PRU 1555 can use to iteratively adjust the switch control signals 1638, 1640, 1642, and 1644 to arrive at the switch control signals 1638, 1640, 1642 and/or a rectifier duty cycle that results in the best transmitter performance under the current load conditions.

While the charging station 110 and PRU 1555 may cooperate to improve transmitter impedance mismatch, power transfer of efficiency, the main burden of control can be assigned primarily to one device over the other. In the case where the control circuitry 1712 specifies a rectifier duty cycle adjustment, the control circuitry 1712 can assume the burden of waiting an appropriate time for the PRU 1555 to implement the change, to re-monitor the transmitter performance and specify a further adjustment as necessary in a search for improved performance.

In other cases, the control circuitry 1712 primarily serves as a source of periodic transmitter performance feedback that is used by the PRU 1555 to adjust the rectifier duty cycle to conform with improved transmitter performance.

While particular control methodologies are outlined above, a wide range of other control techniques can be likewise be employed.

Figure 18:
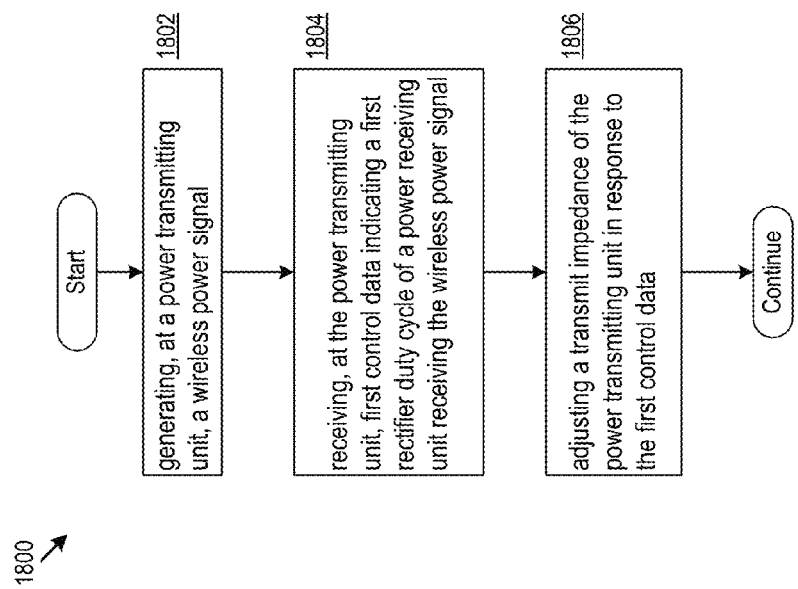
FIG. 18 is a flowchart representation of an embodiment of a method.

FIG. 18 is a flowchart representation 1800 of an embodiment of a method. In particular, a method is presented for use with one or more functions and features described in conjunction with FIGS. 1-17. Step 1802 includes generating, at a power transmitting unit, a wireless power signal. Step 1804 includes receiving, at the power transmitting unit, first control data indicating a first rectifier duty cycle of a power receiving unit receiving the wireless power signal. Step 1806 includes adjusting a transmit impedance of the power transmitting unit in response to the first control data. In various embodiments, the method can include wirelessly associating the power receiving unit with the power transmitting unit via a connection establishment procedure.

Figure 19:
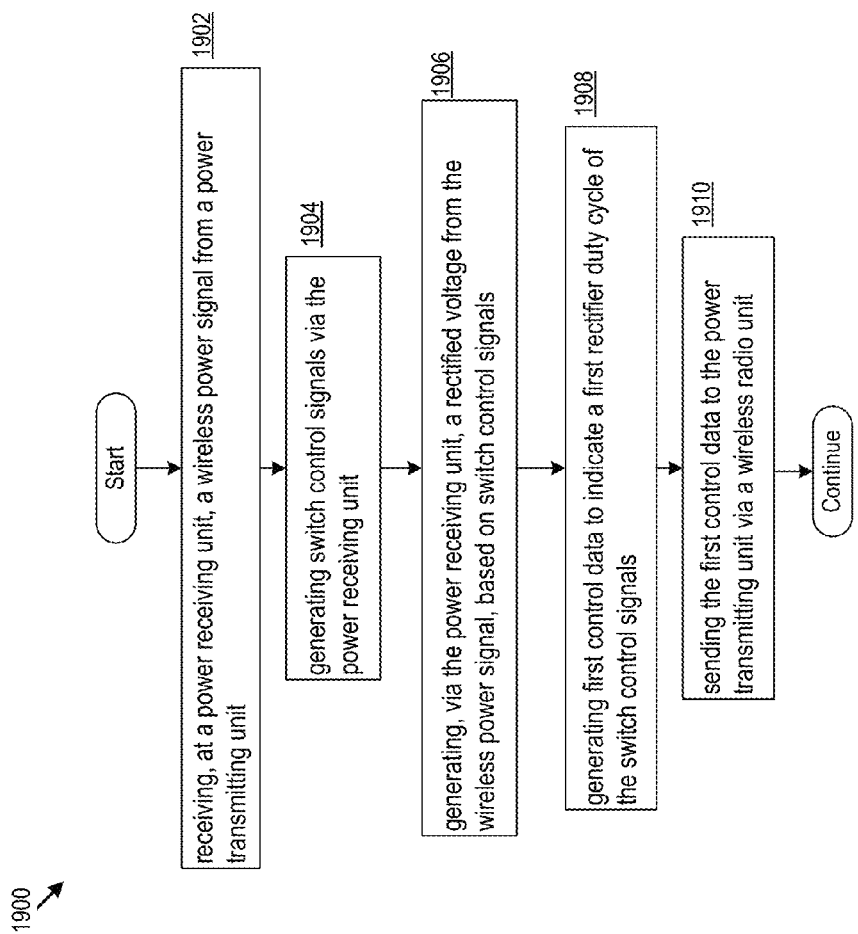
FIG. 19 is a flowchart representation of an embodiment of a method.

FIG. 19 is a flowchart representation 1900 of an embodiment of a method. In particular, a method is presented for use with one or more functions and features described in conjunction with FIGS. 1-18. Step 1902 includes receiving, at a power receiving unit, a wireless power signal from a power transmitting unit. Step 1904 includes generating switch control signals via the power receiving unit. Step 1906 includes generating, via the power receiving unit, a rectified voltage from the wireless power signal, based on switch control signals. Step 1908 includes generating first control data to indicate a first rectifier duty cycle of the switch control signals. Step 1910 includes sending the first control data to the power transmitting unit via a wireless radio unit.

In various embodiments, the power transmitting unit adjusts a transmit impedance in response to the first control data. The method can further include receiving, via the wireless radio unit, second control data from the power transmitting unit; and adjusting the switch control signals in response to the second control data. For example, the second control data can include a second rectifier duty cycle and the switch control signals can be adjusted to achieve the second rectifier duty cycle. The second control data can include transmitter performance data such as an amount of transmitter impedance mismatch, transmitter power, a power efficiency or other transmitter performance metric, and the switch control signals can be adjusted, based on the transmitter performance data.

In a further example the method include receiving, via the wireless radio unit, second control data and updates to the second control data from the power transmitting unit and iteratively adjusting the switch control signals in response to the second control data and the updates of the second control data. The second control data can indicate an amount of transmitter impedance mismatch of the power transmitting unit and the switch control signals can be adjusted to control the amount of transmitter impedance mismatch. The method can include wirelessly associating the power receiving unit with the power transmitting unit via a connection establishment procedure of the wireless radio unit.

Figure 20:
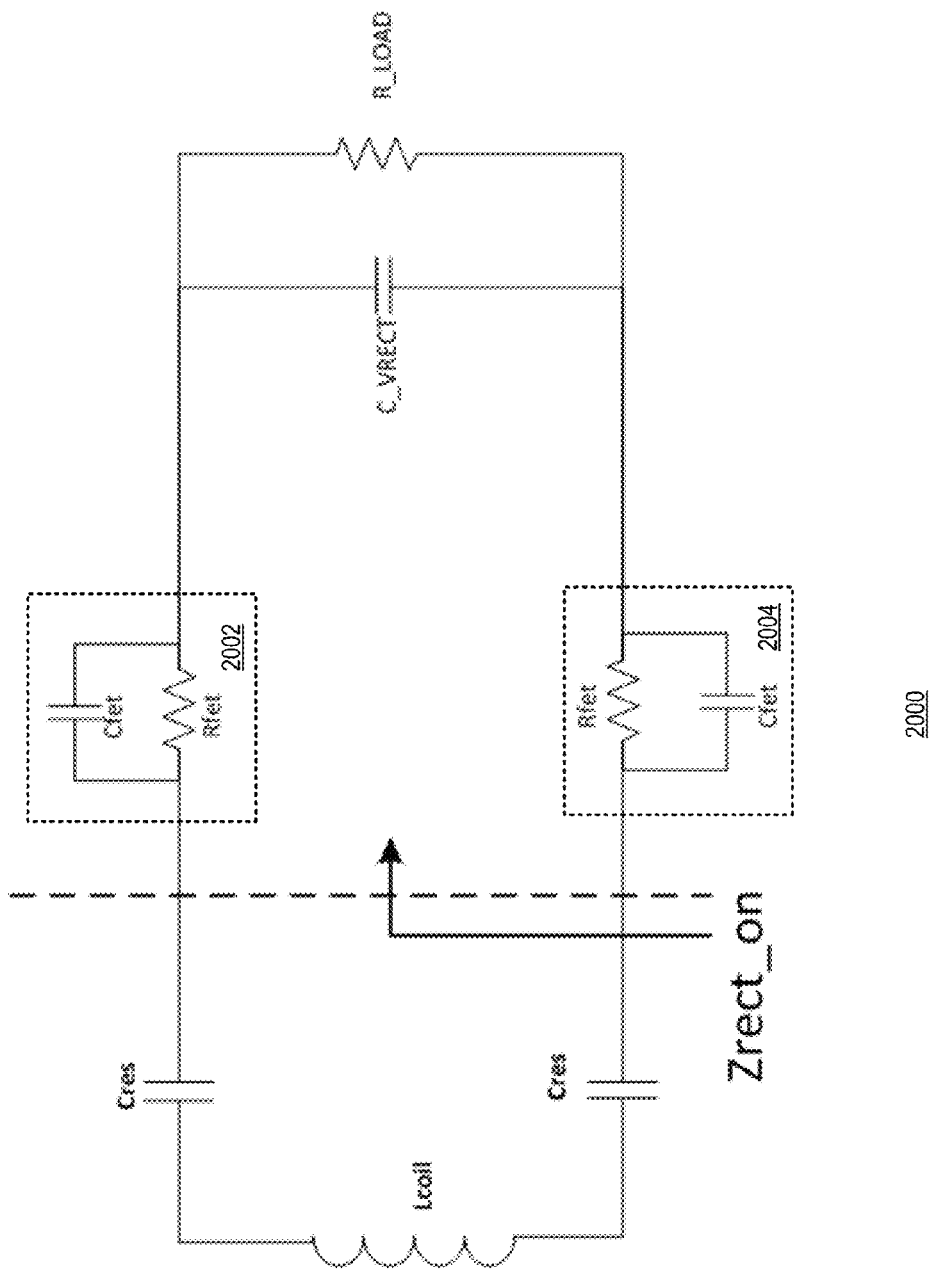
FIGS. 20-21 are schematic block diagrams of an embodiment of a rectifier impedance model.
Figure 21:
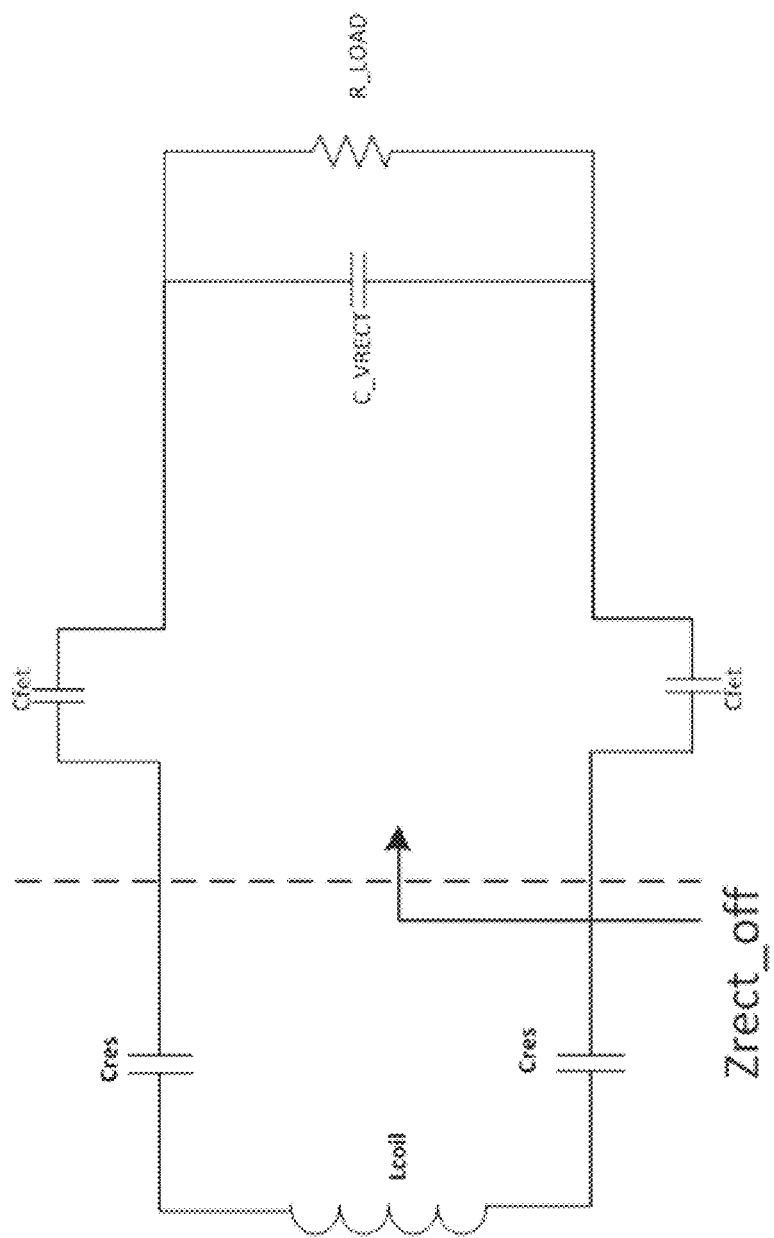

FIGS. 20-21 are schematic block diagrams of an embodiment of a rectifier impedance model. As previously discussed, changes in the rectifier duty cycle can cause variations in the impedance reflected back to the power transmitter circuitry of the charging station 110. In particular, the rectifier impedance changes with the state of the rectifier. As previously discussed, a rectifier control circuit generates switch control signals to turn ON and OFF the switches of the rectifier half-bridge circuits based on voltage thresholds or other timing than can be predetermined or adaptable based on operating conditions. The rectifier conducts current when switches are ON and the rectifier blocks current when switches are OFF. In the embodiment shown, the rectifier switches 2002 and 2004 can consist of an FET in parallel with a body-diode inherent to CMOS device physics. The body-diode conducts when the voltage across diode exceeds a voltage threshold, Vth even when FET is OFF.

FIG. 20 presents a model 2000 of the rectifier impedance in a rectifier ON state, where current is flowing through a half-bridge circuit. In this case, the rectifier switches 2002 and 2004 are modeled as a parallel R-C circuit with the resistance Rfet representing the ON resistance of the switch and the capacitance Cfet representing the capacitance of the switch. FIG. 21 presents a model 2100 of the rectifier impedance in a rectifier OFF state, where no current is flowing through a half-bridge circuit. In the case, the rectifier switches 2002 and 2004 are modeled with the resistor removed.

In operation, the rectifier circuit toggles back and forth between the ON and OFF states two times during each AC cycle of the wireless power signal. When the rectifier is "switched-on", the load impedance Zrect on may appear as predominately resistive. When the rectifier is "switched-off", the load impedance may appear as predominately capacitive. Even though the rectifier is toggling between two different impedances over time, this time-varying impedance is filtered by the receive and transmit coils into a more slowly time varying quantity because the narrow bandwidth of these coils operates to filter the higher order harmonics produced by sharp transitions of this switching.

In various embodiments, the overall average rectifier impedance, $Zrect_{ave}$ can be estimated based on an arithmetic mean of the ON state and OFF state impedances.

$$Zrect_{ave} = \frac{Zrect_{on} * T_{on} + Zrect_{off} * T_{off}}{T_{on} + T_{off}}$$

where $T_{on}$ is the time in the ON state, $T_{off}$ is the time in the OFF state, and where the full period of the wireless power signal, T, can be represented by $$T = T_{on} + T_{off}$$

And the rectifier duty cycle can be represented by:

$$\text{Duty\_Cycle} = T_{on}/T$$

In terms of Duty Cycle:

$$Zrect_{ave} = Zrect_{on} * \text{Duty\_Cycle} + Zrect_{off} * (1 - \text{Duty\_Cycle})$$

Based on the equations for $Zrect_{ave}$ above, it should be noted that for smaller rectifier duty cycles (less than 50%), the rectifier impedance would become more capacitive, because the more capacitive $Zrect_{off}$ term would be weighted more heavily. Conversely, for larger rectifier duty cycles (greater than 50%), the rectifier impedance would become more resistive, because the more resistive $Zrect_{on}$ term would be weighted more heavily.

Simulations presented later in conjunction with FIG. 22 support these conclusions and validate that such an average rectifier impedance can be used in evaluating the effects of changing rectifier duty cycle on the rectifier impedance, and the load impedance as seen by that the charging station. In this fashion, the effects of rectifier duty cycle on changes in the load impedance can be evaluated and/or compensated by the charging station using any of the techniques previously described. While the foregoing has described a particular rectifier impedance estimate based on an arithmetic average of ON and OFF state rectifier impedances, other rectifier models, and other estimation and averaging techniques could likewise be employed.

Figure 22:
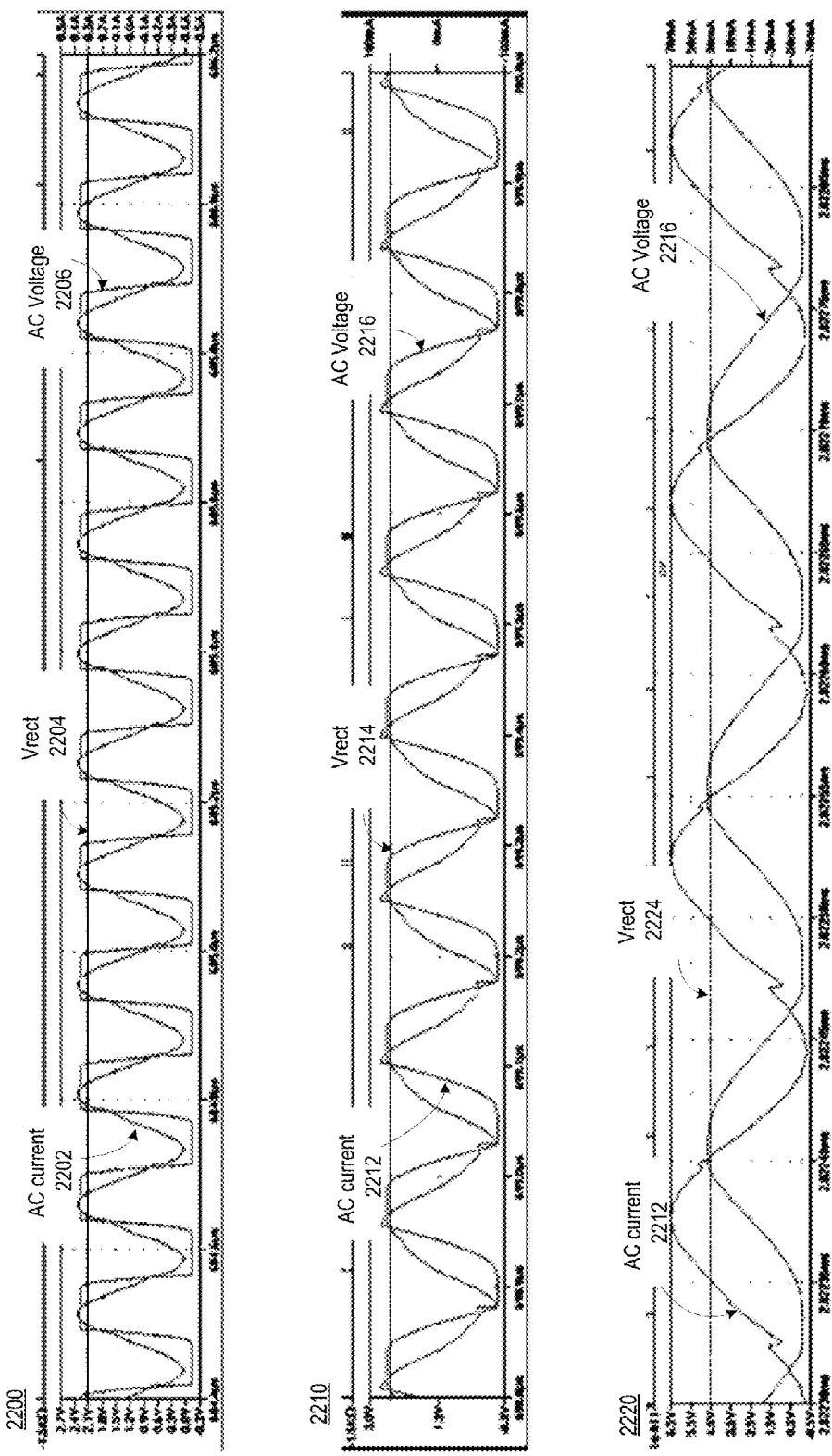
FIG. 22 presents graphical diagram illustrating embodiments of rectifier voltages and currents.

FIG. 22 presents graphical diagram illustrating embodiments of rectifier voltages and currents. In particular, the diagrams 2200, 2210 and 2220 represent simulated results for the AC voltage and AC current for three different loads, and consequently, three different rectifier duty cycles. The simulation results correspond to a 6.78 MHz resonant 1.6 µH Lcoil driven by a wireless power signal from a charging station at the same frequency. The FETs of the rectifier are modeled by an ideal switch with a 0.1Ω on resistance, a 300 pF capacitance, driven by switching signals that turn the switch on with a threshold of 100 mV and off with a threshold of −50 mV. The value of Vrect varies to differing values 2204, 2214 and 2224 as shown. The C_Vrect is set at 8 µF, the and the load resistance R_load is set at 10Ω for diagram 2200, 100Ω for diagram 2210 and 1 kΩ for diagram 2220.

In diagram 2200, the duty cycle is 80% and a 10.4 ns current leading delay is present between the AC current 2202 and the AC voltage 2204. In diagram 2210, the duty cycle is 51% and a 23.5 ns current leading delay is present between the AC current 2212 and the AC voltage 2214. In diagram 2220, the duty cycle is 20% and a 34 ns current leading delay is present between the AC current 2222 and the AC voltage 2224. In summary, the current to voltage (I-V) delay gets smaller with heavier loads as predicted, due to the decreased dominance of the capacitive component and increased dominance of the resistive component of the rectifier impedance.

It should be noted that the forgoing simulation results are presented as merely a demonstration of the effects of rectifier duty cycle on rectifier impedance. Actual wireless power receivers and rectifier circuits could be implemented with different components values, different component types, at different frequencies, etc.

As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may also be used herein, the terms "processing module", "module", "processing circuit", and/or "processing unit" (e.g., including various modules and/or circuitries such as may be operative, implemented, and/or for encoding, for decoding, for baseband processing, etc.) may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory (ROM), random access memory (RAM), volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

Various embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

A physical embodiment of an apparatus, an article of manufacture, a machine, and/or of a process that includes one or more embodiments may include one or more of the aspects, features, concepts, examples, etc. described with herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

The term "module" is used in the description of the various. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various options, methods, functions and features have been expressly described herein, other combinations of these options, methods, functions and features are likewise possible. The various embodiments are not limited by the particular examples disclosed herein and expressly incorporates these other combinations.

What is claimed is:

1. A power receiving unit comprising:
a wireless power receiver configured to receive a wireless power signal from a power transmitting unit;
a wireless radio unit configured to communicate with the power transmitting unit; and
a controllable rectifier circuit configured to rectify the wireless power signal, the controllable rectifier circuit comprising:
a rectifier configured to generate a rectified voltage from the wireless power signal, based on switch control signals; and
a rectifier control circuit configured to generate the switch control signals and to generate first control data that indicates a first rectifier duty cycle of the switch control signals, wherein the first rectifier duty cycle is a percentage and wherein the first control data includes the percentage;
wherein the wireless radio unit sends the first control data to the power transmitting unit;
wherein the wireless radio unit receives second control data from the power transmitting unit; and
wherein the rectifier control circuit adjusts the switch control signals in response to the second control data.

2. The power receiving unit of claim 1 wherein the power transmitting unit adjusts a transmit impedance in response to the first control data.

3. The power receiving unit of claim 1 wherein the second control data includes a second rectifier duty cycle and wherein the rectifier control circuit adjusts the switch control signals to achieve the second rectifier duty cycle.

4. The power receiving unit of claim 1 wherein the second control data includes transmitter performance data and wherein the rectifier control circuit adjusts the switch control signals, based on the transmitter performance data.

5. The power receiving unit of claim 4 wherein the transmitter performance data indicates an amount of transmitter impedance mismatch of the power transmitting unit.

6. The power receiving unit of claim 1 wherein the wireless radio unit receives updates to the second control data from the power transmitting unit; and
wherein the rectifier control circuit iteratively adjusts the switch control signals in response to and the updates of the second control data.

7. The power receiving unit of claim 6 wherein the second control data indicates an amount of transmitter impedance mismatch of the power transmitting unit and the rectifier control circuit iteratively adjusts the switch control signals to control the amount of transmitter impedance mismatch.

8. The power receiving unit of claim 1 wherein the wireless radio unit associates with the power transmitting unit via a connection establishment procedure.

9. A method comprising:
receiving, at a power receiving unit, a wireless power signal from a power transmitting unit;
generating switch control signals via the power receiving unit;
generating, via the power receiving unit, a rectified voltage from the wireless power signal, based on switch control signals;
generating first control data to indicate a first rectifier duty cycle of the switch control signals, wherein the first rectifier duty cycle is a percentage and wherein the first control data includes the percentage; and
sending the first control data to the power transmitting unit via a wireless radio unit;
receiving, via the wireless radio unit, second control data from the power transmitting unit; and
adjusting the switch control signals in response to the second control data.

10. The method of claim 9 wherein the power transmitting unit adjusts a transmit impedance in response to the first control data.

11. The method of claim 9 wherein the second control data includes a second rectifier duty cycle and wherein the switch control signals are adjusted to achieve the second rectifier duty cycle.

12. The method of claim 9 wherein the second control data includes transmitter performance data and wherein the switch control signals are adjusted, based on the transmitter performance data.

13. The method of claim 12 wherein the transmitter performance data indicates an amount of transmitter impedance mismatch of the power transmitting unit.

14. The method of claim 9 receiving, via the wireless radio unit, updates to the second control data from the power transmitting unit; and
iteratively adjusting the switch control signals in response to the updates of the second control data.

15. The method of claim 14 wherein the second control data indicates an amount of transmitter impedance mismatch of the power transmitting unit and the switch control signals are adjusted to control the amount of transmitter impedance mismatch.

16. The method of claim 9 further comprising:
wirelessly associating the power receiving unit with the power transmitting unit via a connection establishment procedure of the wireless radio unit.

17. A power receiving unit comprising:
a wireless power receiver configured to receive a wireless power signal from a power transmitting unit;
a wireless radio unit configured to communicate with the power transmitting unit; and
a controllable rectifier circuit configured to rectify the wireless power signal, the controllable rectifier circuit comprising:
a rectifier configured to generate a rectified voltage from the wireless power signal, based on switch control signals; and
a rectifier control circuit configured to generate the switch control signals and to generate first control data that indicates a first rectifier duty cycle of the switch control signals, wherein the first rectifier duty cycle is a percentage and wherein the first control data includes the percentage;
wherein the wireless radio unit sends the first control data to the power transmitting unit;
wherein the wireless radio unit receives second control data from the power transmitting unit; and
wherein the rectifier control circuit iteratively adjusts the switch control signals in response to the second control data.

18. The power receiving unit of claim 17 wherein the power transmitting unit adjusts a transmit impedance in response to the first control data.

19. The power receiving unit of claim 17 wherein the second control data includes a second rectifier duty cycle and wherein the rectifier control circuit iteratively adjusts the switch control signals to achieve the second rectifier duty cycle.

20. The power receiving unit of claim 17 wherein the second control data includes transmitter performance data and wherein the rectifier control circuit iteratively adjusts the switch control signals, based on the transmitter performance data.

* * * * *